United States Patent
Kumomi et al.

(10) Patent No.: US 8,237,166 B2
(45) Date of Patent: *Aug. 7, 2012

(54) DISPLAY

(75) Inventors: Hideya Kumomi, Yokohama (JP); Hideo Hosono, Yokohama (JP); Toshio Kamiya, Yokohama (JP); Kenji Nomura, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/848,671

(22) Filed: Aug. 2, 2010

(65) Prior Publication Data

US 2010/0295041 A1 Nov. 25, 2010

Related U.S. Application Data

(62) Division of application No. 11/269,767, filed on Nov. 9, 2005, now Pat. No. 7,791,072.

(30) Foreign Application Priority Data

Nov. 10, 2004 (JP) ................................ 2004-326682

(51) Int. Cl.
*H01L 31/20* (2006.01)

(52) U.S. Cl. ............. 257/59; 257/57; 257/62; 257/72; 257/E33.004; 257/E31.047; 257/E31.094; 257/E29.083; 257/E29.092

(58) Field of Classification Search .................. 257/43, 257/52, 57, 59, E29.083, 92, 101

See application file for complete search history.

(56) References Cited

U.S. PATENT DOCUMENTS

| | | | |
|---|---|---|---|
| 6,075,256 | A | 6/2000 | Kaifu et al. ...................... 257/53 |
| 6,524,153 | B1 | 2/2003 | Ikeda et al. ...................... 445/24 |
| 6,727,883 | B2 | 4/2004 | Uno et al. ...................... 345/107 |
| 6,909,114 | B1 * | 6/2005 | Yamazaki ........................ 257/66 |
| 7,189,992 | B2 | 3/2007 | Wager, III et al. .............. 257/43 |
| 7,791,072 | B2 * | 9/2010 | Kumomi et al. ................. 257/59 |
| 2003/0218222 | A1 | 11/2003 | Wager, III et al. ............ 257/430 |
| 2004/0147065 | A1 | 7/2004 | Kitakado et al. .............. 438/151 |
| 2005/0072973 | A1 | 4/2005 | Kim ................................ 257/59 |
| 2005/0173734 | A1 | 8/2005 | Yoshioka et al. ............. 257/202 |
| 2005/0199959 | A1 | 9/2005 | Chiang et al. ................. 257/368 |
| 2006/0108529 | A1 | 5/2006 | Saito et al. ................. 250/338.4 |
| 2006/0113539 | A1 | 6/2006 | Sano et al. ...................... 257/59 |
| 2006/0113565 | A1 | 6/2006 | Abe et al. ...................... 257/197 |

FOREIGN PATENT DOCUMENTS

JP 05-251705 9/1993

(Continued)

OTHER PUBLICATIONS

Nomura et al., "Room-temperature Fabrication of Transparent Flexible Thin-film Transistors Using Amorphous Oxide Semiconductors," *Nature*, vol. 432, 488-492 (2004).

Takagi et al., "Carrier Transport and Electronic Structure in Amorphous Oxide Semiconductor, a-InGaZnO₄," *Thin Solid Films*, vol. 486, 38-41 (2005).

(Continued)

*Primary Examiner* — Minchul Yang
(74) *Attorney, Agent, or Firm* — Fitzpatrick, Cella, Harper & Scinto

(57) ABSTRACT

An active matrix display comprising a light control device and a field effect transistor for driving the light control device. The active layer of the field effect transistor comprises an amorphous.

33 Claims, 6 Drawing Sheets

FOREIGN PATENT DOCUMENTS

| | | |
|---|---|---|
| JP | 08-032094 | 2/1996 |
| JP | 11-202804 | 7/1999 |
| JP | 2000-44236 | 2/2000 |
| JP | 2002-289859 A | 10/2002 |
| JP | 2003-298062 | 10/2003 |
| JP | 2004-103957 | 4/2004 |
| JP | 2004-179195 A | 6/2004 |
| JP | 2004-273614 A | 9/2004 |
| JP | 2004-071477 A1 | 9/2005 |
| WO | WO 03/098699 | 11/2003 |
| WO | WO 2004/038757 | 5/2004 |
| WO | WO 2005/088726 | 9/2005 |
| WO | WO 2005/093846 | 10/2005 |
| WO | WO 2005/093847 | 10/2005 |
| WO | WO 2005/093848 | 10/2005 |
| WO | WO 2005/093849 | 10/2005 |
| WO | WO 2005/093850 | 10/2005 |
| WO | WO 2005/093851 | 10/2005 |
| WO | WO 2005/093852 | 10/2005 |
| WO | WO 2006/051993 | 5/2006 |
| WO | WO 2006/051994 | 5/2006 |
| WO | WO 2006/051995 | 5/2006 |

OTHER PUBLICATIONS

Nomura et al., "Thin-Film Transistor Fabricated in Single-Crystalline Transparent Oxide Semiconductor," *Science*, vol. 300, 1269-1272 (2003).

Fortunato et al., "Wide-bandgap High-mobility ZnO Thin-film Transistors Produced at Room Temperature", *Appl. Phys Lett.*, vol. 85, No. 13, 2541-2543 (Sep. 2004).

"Carrier Transport in Transparent Amorphous Oxide Semiconductor InGaZnO$_4$", Nomura et al.; Preprint 31a-ZA-6 of 51th Meeting of Union of applied Phys. Soc., Mar. 2004, Tokyo University of Technology.

"Room Temperature Fabrication and Carrier Transport . . . (>10 cm$^2$/Vs)", Kamiya et al.; Preprint 1a-F-5 of 65$^{th}$ Meeting of Appl. Phys. Soc., Sep. 2004, Tohoku Gakuen University.

Narushima et al., "A p-Type Amorphous Oxide Semiconductor and Room Temperature Fabrication of Amorphous Oxide p-n Heterojunction Diodes", *Adv. Mater.*, vol. 15, No. 17, 1409-1413 (Sep. 2003).

Office Action in Japanese Application No. 2005-325365 (Jan. 11, 2012) (11 pages).

* cited by examiner

DISPLAY

CROSS-REFERENCE TO RELATED APPLICATIONS

This application is a division of application Ser. No. 11/269,767, filed Nov. 9, 2005, which claims priority from Japanese Patent Application No. 2004-326682, filed on Nov. 10, 2004. Both prior applications are hereby incorporated herein by reference.

BACKGROUND OF THE INVENTION

1. Field of the Invention

The present invention relates to a display using an amorphous oxide for an active layer of a transistor.

2. Related Background Art

In recent years, flat panel displays (FPD's) have been put into practical use owing to the progress of a technique for a liquid crystal, electroluminescence (EL), or the like.

Those FPD's are each driven by an active matrix circuit of a field effect thin film transistor (TFT) using an amorphous silicon thin film or a polycrystalline silicon thin film arranged on a glass substrate for an active layer.

Meanwhile, attempts have been made to use a resin substrate having a light weight and flexibility instead of a glass substrate for reducing the thickness and weight of each of those FPD's and for improving the resistance to breakage thereof.

However, the production of a transistor using the above-described silicon thin film requires a step of heating at a relatively high temperature, so it is generally difficult to directly form the silicon thin film on a resin substrate having low heat resistance.

In view of the foregoing, the development of a TFT using an oxide semiconductor thin film made of, for example, ZnO that can be formed into a film at a low temperature has been vigorously conducted (JP 2003-298062 A).

Meanwhile, no technical level to develop an applied technology of a conventional TFT using an oxide semiconductor thin film has been achieved probably because the TFT has no sufficient properties comparable to those of a TFT using silicon.

SUMMARY OF THE INVENTION

An object of the present invention is to provide a novel display using a transistor using an oxide for its active layer.

According to a first gist of the present invention, there is provided an active matrix display including:
  a light control device; and
  a field effect transistor for driving the light control device,
in which an active layer of the field effect transistor is an amorphous oxide having an electron carrier concentration of less than $10^{18}/cm^3$.

According to a second gist of the present invention, there is provided an active matrix display including:
  a light control device; and
  a field effect transistor for driving the light control device,
in which an active layer of the field effect transistor is an amorphous oxide of which the electron mobility tends to increase with increasing electron carrier concentration.

According to a third gist of the present invention, there is provided an active matrix display including:
  a light control device; and
  a field effect transistor for driving the light control device,
in which an active layer of the field effect transistor has an amorphous oxide semiconductor capable of realizing normally-off of the field effect transistor.

The inventors of the present invention have made investigation into an oxide semiconductor. As a result, they have found that ZnO cannot generally form a stable amorphous phase. In addition, most ZnO shows a polycrystalline phase. Therefore, a carrier is scattered at an interface between polycrystalline particles, with the result that electron mobility cannot be increased.

In addition, an oxygen defect is apt to enter ZnO. As a result, a large number of carrier electrons are generated, so it is difficult to reduce electric conductivity. It has been found that, owing to the foregoing, even when no gate voltage is applied to a transistor, a large current flows between a source terminal and a drain terminal, so a normally-off operation of a TFT cannot be realized. It seems also difficult to increase on-off ratio of the transistor.

In addition, the inventors of the present invention have examined an amorphous oxide film $Zn_xM_yIn_zO_{(x+3y/2+3z/2)}$ (where M represents at least one element of Al and Ga) described in JP 2000-044236 A. The material has an electron carrier concentration of $10^{18}/cm^3$ or more, so it is suitable for a mere transparent electrode.

However, it has been found that, when an oxide having an electron carrier concentration of $10^{18}/cm^3$ or more is used for a channel layer of a TFT, sufficient on-off ratio cannot be secured, so the oxide is not appropriate for a normally-off TFT.

That is, a conventional amorphous oxide film has been unable to provide a film having an electron carrier concentration of less than $10^{18}/cm^3$.

In view of the foregoing, the inventors of the present invention have produced a TFT using an amorphous oxide having an electron carrier concentration of less than $10^{18}/cm^3$ for an active layer of a field effect transistor. As a result, they have obtained a TFT having desired properties, and have discovered that the TFT is applicable to a display.

The inventors of the present invention have conducted vigorous research and development concerning $InGaO_3(ZnO)_m$ and conditions under which the material is formed into a film. As a result, they have found that an electron carrier concentration of less than $10^{18}/cm^3$ can be achieved by controlling the conditions of an oxygen atmosphere upon film formation.

The present invention relates to a display using a film that has realized a desired electron carrier concentration.

Hereinafter, the present invention will be described in detail.

The light control device to be used in the present invention is a non-selfluminous electro-optic element such as a liquid crystal device or a device containing an electrophoretic particle.

The light control device may be constituted by means of a liquid crystal, and an orientation film and an insulation film may be arranged in this order from the side of the liquid crystal between the active layer and the liquid crystal.

The light control device may be constituted by means of a liquid crystal, and an orientation film and an insulation film may be arranged in the stated order from the side of the liquid crystal between the gate electrode of the field effect transistor and the liquid crystal.

The insulation film is, for example, a silicon oxide film or a silicon nitride film.

The present invention relates to a light control device with its light transmittance or light reflectance controlled by an output from a field effect transistor.

In addition, an output terminal of a field effect transistor having, as an active layer, an amorphous semiconductor containing In, Ga, Zn, and O and having an electron carrier concentration of less than $10^{18}/cm^3$ is connected to an electrode of a light transmittance control device or of a light reflectance control device.

In further aspect of the present invention, the light-emitting device is an electroluminescent device.

In further aspect of the present invention, the light transmittance control device or the light reflectance control device is a liquid crystal cell.

In further aspect of the present invention, the light transmittance control device or the light reflectance control device is an electrophoretic particle cell.

In further aspect of the present invention, the electrophoretic particle cell is a cell having counter electrodes and a capsule in which a fluid and a particle are sealed, the capsule being sandwiched between the counter electrodes.

In further aspect of the present invention, the light control device is arranged on a flexible resin substrate.

In further aspect of the present invention, the light control device is arranged on a light transmissive substrate.

In further aspect of the present invention, the multiple light control devices are arranged two-dimensionally together with the multiple field effect transistors wired in an active matrix manner.

According to another aspect of the present invention, there is provided a broadcasting dynamic image display device such as a television receiving set including the above-described display.

According to another aspect of the present invention, there is provided a digital information processing device such as a computer including the above-described display.

According to another aspect of the present invention, there is provided portable information equipment such as a cellular phone, a portable music reproducer, or a portable dynamic image reproducer including the above-described display.

According to another aspect of the present invention, there is provided an image pickup device such as a still camera or a movie camera including the above-described display for a viewfinder of the image pickup device, for observing a photographed image, for displaying photography information, or for other purposes.

According to another aspect of the present invention, there is provided a building structure such as a window, a door, a ceiling, a floor, an inner wall, an outer wall, or a partition including the above-described display for displaying an image on the surface of the building structure.

According to another aspect of the present invention, there is provided a structure such as a window, a door, a ceiling, a floor, an inner wall, an outer wall, or a partition for a movable body such as a vehicle, an airplane, or a ship including the above-described display for displaying an image on the surface of the structure.

According to another aspect of the present invention, there is provided an advertising device such as advertising means in a vehicle of a public transportation, or a signboard or advertising tower in a city including the above-described display for displaying an image on the adverting device.

According to another aspect of the present invention, there is provided a light control device including: a light transmittance control device; a light reflectance control device; and a field effect transistor having, as an active layer, an amorphous oxide having an electron carrier concentration of less than $10^{18}/cm^3$ at room temperature, in which an output terminal of the field effect transistor is connected to an electrode of the light transmittance control device or of the light reflectance control device.

According to another aspect of the present invention, there is provided a light control device including: a light transmittance control device; a light reflectance control device; and a field effect transistor having, as an active layer, an amorphous oxide whose electron mobility increases with increasing electron carrier concentration, in which an output terminal of the field effect transistor is connected to an electrode of the light transmittance control device or of the light reflectance control device.

According to a forth gist of the present invention, there is provided an active matrix display comprising:
a first electrode;
a second electrode;
a liquid crystal interposed between the first and second electrodes; and
a field effect transistor for driving the liquid crystal,
wherein an active layer of the transistor comprises an amorphous oxide, and
wherein the transistor is a normally-off transistor.

The amorphous oxide is preferably an oxide containing In, Zn and Sn, an oxide containing In and Zn, an oxide containing In and Sn, or an oxide containing In.

In addition it is preferable that the active matrix display further comprises an orientation film and an insulation film arranged in this order from a side of the liquid crystal between a gate electrode of the field effect transistor and the liquid crystal.

According to the present invention, there can be provided a novel display.

As in one aspect of the present invention, when the display is used for a light transmissive substrate, for example, when the display is used as a light transmissive member such as a glass-type information equipment, a building structure, or a window of a movable body, a so-called see-through display can be provided.

The reason for the foregoing is as follows. The field effect transistor according to the present invention including its active layer is transparent, or has transmissivity, with respect to visible light. Therefore, external light that has passed through the window, and a display image on the device or device of the present invention can be seen on the same optical axis.

DESCRIPTION OF THE PREFERRED EMBODIMENTS

First Embodiment

Figure 1:
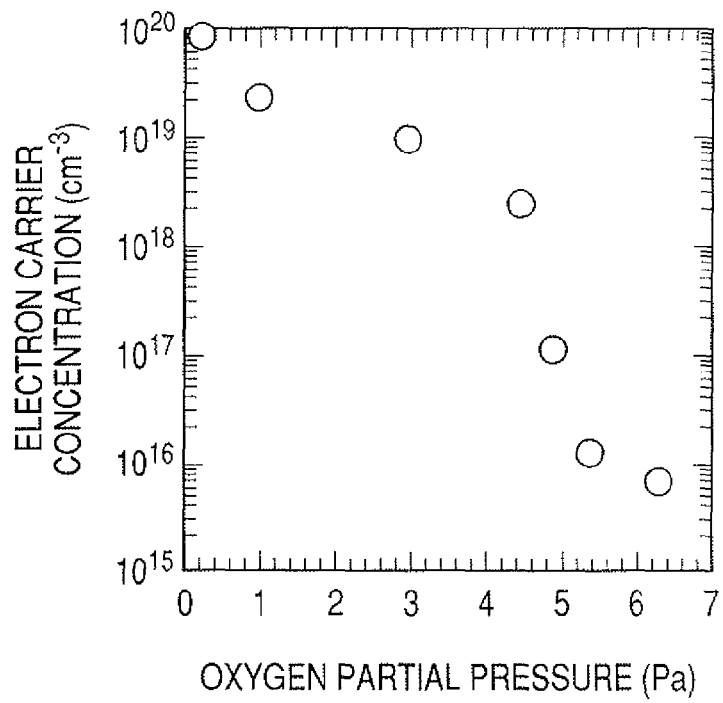
FIG. 1 is a graph showing a relationship between the electron carrier concentration of an In—Ga—Zn—O-based amorphous oxide formed into a film by means of a pulse laser deposition method and an oxygen partial pressure upon film formation.

The active matrix display according to the present invention will be described with reference to FIG. 8.

In the figure, reference numeral 11 denotes a base substance or substrate; 12, an amorphous oxide; 13, a source electrode; 14, a drain electrode; 18, an electrode (pixel electrode); 15, a gate insulation film; 16, a gate electrode; 21 and 22, high-resistance films; and 23, a portion containing a liquid crystal or an electrophoretic particle. The portion 23 constitutes part of the light control device in the present invention. Reference numeral 20 denotes an electrode or a substrate having an electrode. An example of the electrode includes a transparent electrode such as ITO.

In the present invention, an output terminal (corresponding to the drain electrode 14) of a field effect transistor for driving the light control device constituted by a liquid crystal or the like is connected to the electrode 18 constituting the light control device.

The light control device as employed in the present invention may be referred to also as a light modulation device.

In addition, an amorphous oxide having an electron carrier concentration of less than $10^{18}/cm^3$ is used for the active layer 12 of the field effect transistor.

An amorphous oxide whose electron mobility tends to increase with increasing electron carrier concentration can also be used in the present invention.

When a liquid crystal is used for the light control device, the high-resistance film 21 or 22 serves as an orientation film (such as polyimide) for orienting the liquid crystal.

Figure 8:
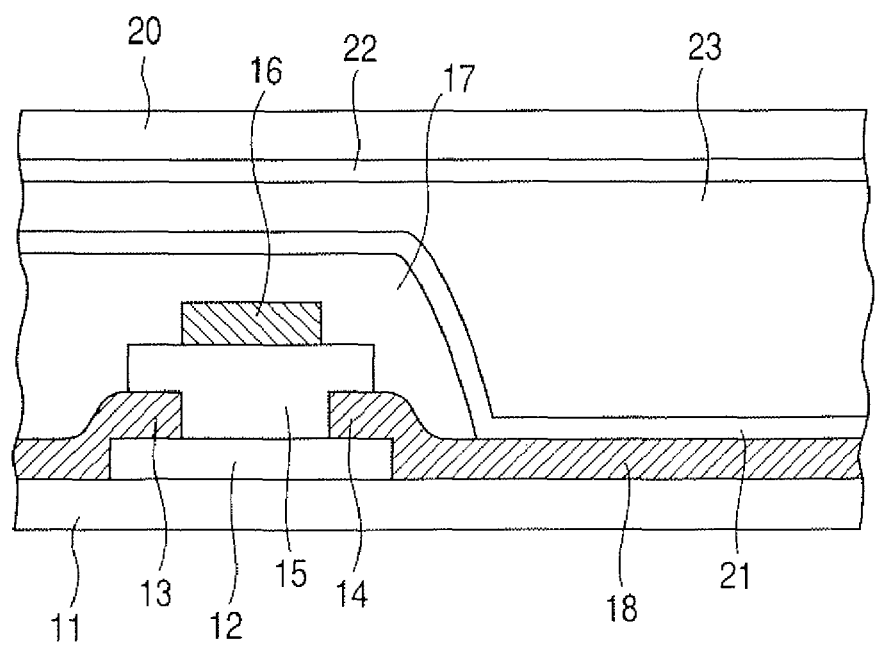
FIG. 8 is a schematic sectional view of a light control device.

In FIG. 8, reference numeral 17 denotes an interlayer insulation film. The insulation film 17 and the high-resistance film 21 may be constituted by the same material.

However, the high-resistance film (orientation film) 21 and the insulation film 17 are desirably formed of different materials for improving their insulating properties. For example, silicon oxide or silicon nitride is used for the insulation film 17.

In particular, it is preferable to use the insulation film 17 constituted by silicon nitride or the like to separate the amorphous oxide or the gate insulation film 15 from the liquid crystal. This is because the penetration of unexpected atoms or ion species from the liquid crystal or the like into the gate insulation film and the amorphous oxide constituting the field effect transistor can be suppressed. The gate insulation film 15 and the insulation film 17 may be constituted by different materials.

Any other layer except the orientation film may be interposed between the liquid crystal and the insulation film 17.

(Amorphous Oxide)

The electron carrier concentration of the amorphous oxide according to the present invention is a value measured at room temperature. Room temperature is, for example, 25° C., and, specifically, is a temperature appropriately selected from the range of about 0° C. to 40° C. It should be noted that there is no need for the electron carrier concentration of the amorphous oxide according to the present invention to have a value of less than $10^{18}/cm^3$ in the entire range of 0° C. to 40° C. For example, an electron carrier concentration of less than $10^{18}/cm^3$ has only to be realized at 25° C. In addition, reducing the electron carrier concentration to $10^{17}/cm^3$ or less, or more preferably $10^{16}/cm^3$ or less provides a normally-off TFT in high yield.

The electron carrier concentration of less than $10^{18}/cm^3$ is preferably an electron carrier concentration of less than $1 \times 10^{18}/cm^3$, more preferably an electron carrier concentration of less than $1.0 \times 10^{18}/cm^3$.

The electron carrier concentration can be measured through Hall effect measurement.

The term "amorphous oxide" as used herein refers to an oxide having a halo pattern to be observed, and showing no specific diffraction ray, in an X-ray diffraction spectrum.

The lower limit for the electron carrier concentration in the amorphous oxide of the present invention is not particularly limited as long as the amorphous oxide is applicable to a channel layer of a TFT. The lower limit is, for example, $10^{12}/cm^3$.

Therefore, in the present invention, as in each of the examples to be described later, the electron carrier concentration is set to fall within the range of, for example, preferably $10^{12}/cm^3$ (inclusive) to $10^{18}/cm^3$ (exclusive), more preferably $10^{13}/cm^3$ to $10^{17}/cm^3$ (both inclusive), or still more preferably $10^{15}/cm^3$ to $10^{16}/cm^3$ (both inclusive) by controlling the material, composition ratio, production conditions, and the like of the amorphous oxide.

In addition to an InZnGa oxide, the amorphous oxide can be appropriately selected from an In oxide, an $In_xZn_{1-x}$ oxide ($0.2 \leq x \leq 1$), an $In_xSn_{1-x}$ oxide ($0.8 \leq x \leq 1$), and an $In_x(Zn, Sn)_{1-x}$ oxide ($0.15 \leq x \leq 1$).

The $In_x(Zn, Sn)_{1-x}$ oxide can be described as an $In_x(Zn_ySn_{1-y})_{1-x}$ oxide, and y ranges from 1 to 0.

Part of In in an In oxide containing none of Zn and Sn can be replaced with Ga. That is, the In oxide can be turned into an $In_xGa_{1-x}$ oxide ($0 \leq x \leq 1$).

Hereinafter, an amorphous oxide having an electron carrier concentration of less than $10^{18}/cm^3$ that the inventors of the present invention have succeeded in producing will be described in detail.

The oxide contains In—Ga—Zn—O, its composition in a crystalline state is represented by $InGaO_3(ZnO)_m$ (where m represents a natural number of less than 6), and its electron carrier concentration is less than $10^{18}/cm^3$.

The oxide contains In—Ga—Zn—Mg—O, its composition in a crystalline state is represented by $InGaO_3(Zn_{1-x}Mg_xO)_m$ (where m represents a natural number of less than 6 and $0 < x \leq 1$), and its electron carrier concentration is less than $10^{18}/cm^3$.

A film constituted by each of those oxides is also preferably designed to have an electron mobility in excess of 1 $cm^2/(V \cdot sec)$.

The use of the film for a channel layer enables transistor characteristics including a gate current at the time of turning a transistor off of less than 0.1 μA (that is, normally off) and an on-off ratio in excess of $10^3$. In addition, the use realizes a flexible TFT which is transparent, or has transmissivity, with respect to visible light.

The electron mobility of the film increases with increasing number of conduction electrons. A glass substrate, a plastic substrate made of a resin, a plastic film, or the like can be used as a substrate for forming a transparent film.

When the amorphous oxide film is used for a channel layer, one of $Al_2O_2$, $Y_2O_2$, and $HfO_2$, or a mixed crystal compound containing at least two kinds of these compounds can be used for a gate insulation film.

It is also preferable to form the amorphous oxide into a film in an atmosphere containing an oxygen gas without intentionally adding any impurity ion for increasing electrical resistance to the amorphous oxide.

The inventors of the present invention have found that the semi-insulating oxide amorphous thin film has specific property with which the electron mobility of the film increases with increasing number of conduction electrons. Furthermore, the inventors have found that a TFT produced by means of the film is provided with additionally improved transistor characteristics including an on-off ratio, a saturation current in a pinch-off state, and a switching speed. That is, the inventors have found that a normally-off TFT can be realized by using an amorphous oxide.

The use of the amorphous oxide thin film for a channel layer of a film transistor provides an electron mobility in excess of 1 $cm^2/(V \cdot sec)$, preferably in excess of 5 $cm^2/(V \cdot sec)$.

When the electron carrier concentration is less than $10^{18}/cm^3$, or preferably less than $10^{16}/cm^3$, a current between drain and source terminals at the time of off (when no gate voltage is applied) can be set to be less than 10 μA, or preferably less than 0.1 μA.

The use of the film provides a saturation current after pinch-off in excess of 10 μA and an on-off ratio in excess of $10^3$ when the electron mobility exceeds 1 $cm^2/(V \cdot sec)$, or preferably exceeds 5 $cm^2/(V \cdot sec)$.

In a TFT, a high voltage is applied to a gate terminal in a pinch-off state, and electrons are present in a channel at a high density.

Therefore, according to the present invention, a saturation current value can be increased by an amount corresponding to an increase in electron mobility. As a result, improvements of transistor characteristics including an increase in on-off ratio, an increase in saturation current, and an increase in switching speed can be expected.

In a typical compound, when the number of electrons increases, electron mobility reduces owing to a collision between electrons.

Examples of a structure that can be used for the TFT include: a staggered (top gate) structure in which a gate insulation film and a gate terminal are formed in order on a semiconductor channel layer; and an inversely staggered (bottom gate) structure in which a gate insulation film and a semiconductor channel layer are formed in order on a gate terminal.

(First Film Forming Method: PLD Method)

The amorphous state of an amorphous oxide thin film whose composition in a crystalline state is represented by $InGaO_3(ZnO)_m$ (where m represents a natural number of less than 6) is stably maintained up to a high temperature equal to or higher than 800° C. when the value of m is less than 6. However, as the value of m increases, that is, as the ratio of ZnO to $InGaO_3$ increases to cause the composition to be close to the ZnO composition, the thin film is apt to crystallize.

Therefore, a value of m of less than 6 is preferable for a channel layer of an amorphous TFT.

A vapor phase deposition method involving the use of a polycrystalline sintered material having an $InGaO_3(ZnO)_m$ composition as a target is a desirable film forming method. Of such vapor phase deposition methods, a sputtering method and a pulse laser deposition method are suitable. Furthermore, a sputtering method is most suitable from the viewpoint of mass productivity.

However, when the amorphous film is produced under typical conditions, an oxygen defect mainly occurs, so it has been unable to provide an electron carrier concentration of less than $10^{18}/cm^3$, that is, an electric conductivity of 10 S/cm or less. The use of such film makes it impossible to constitute a normally-off transistor.

Figure 9:
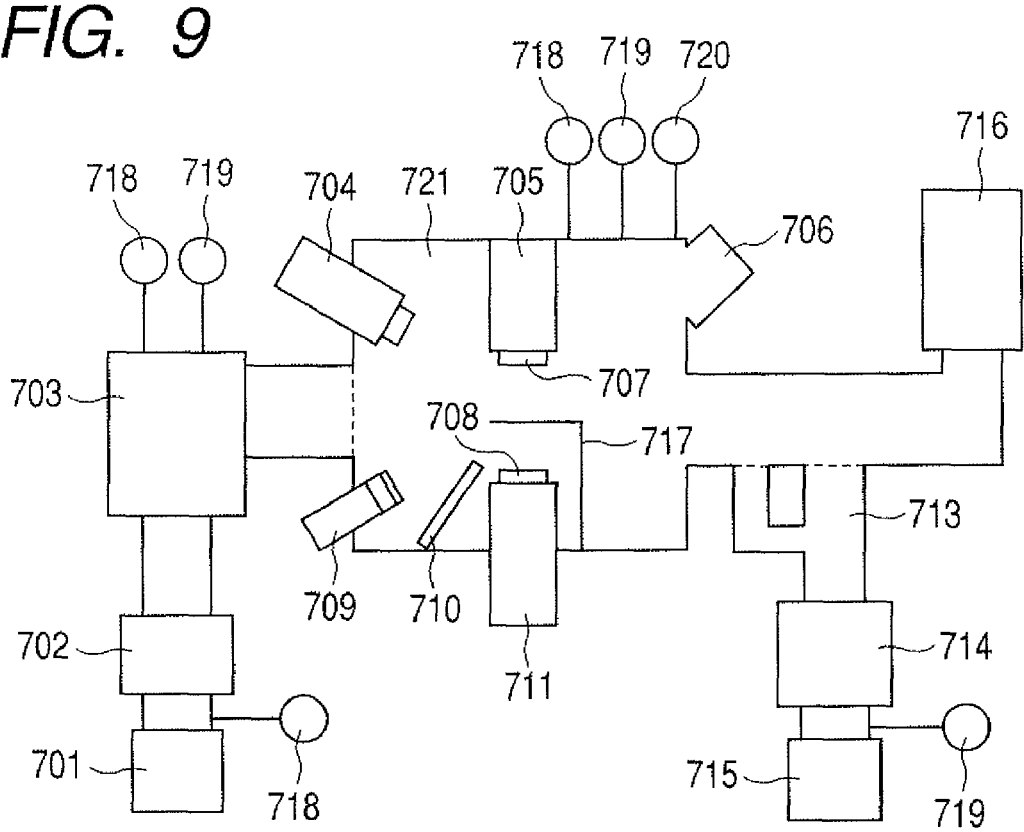
FIG. 9 is a schematic view showing a pulse laser deposition apparatus.

The inventors of the present invention have produced In—Ga—Zn—O by means of a pulse laser deposition method with the aide of an apparatus shown in FIG. 9.

Film formation was performed by means of such PLD film forming apparatus as shown in FIG. 9.

In the figure, reference numeral 701 denotes a rotary pump (RP); 702, a turbo-molecular pump (TMP); 703, a preparatory chamber; 704, an electron gun for RHEED; 705, substrate holding means for rotating, and moving vertically, a substrate; 706, a laser entrance window; 707, the substrate; 708, a target; 709, a radical source; 710, a gas inlet; 711, target holding means for rotating, and moving vertically, the target; 712, a bypass line; 713, a main line; 714, a turbo-molecular pump (TMP); 715, a rotary pump (RP); 716, a titanium getter pump; and 717, a shutter. In addition, in the figure, reference numeral 718 denotes an ion vacuum gauge (IG); 719, a Pirani vacuum gauge (PG); 720, a baratron vacuum gauge (BG); and 721, a growth chamber (chamber).

An In—Ga—Zn—O-based amorphous oxide semiconductor thin film was deposited on an $SiO_2$ glass substrate (1737 manufactured by Corning Inc.) by means of a pulse laser deposition method using a KrF excimer laser. Prior to the deposition, the substrate was subjected to degreasing washing by means of an ultrasonic wave for 5 minutes in each of acetone, ethanol, and ultrapure water, and was then dried in the air at 100° C.

An $InGaO_3(ZnO)_4$ sintered material target (having a diameter of 20 mm and a thickness of 5 mm in size) was used as the polycrystalline target. The target was produced by wet-mixing 4N reagents of $In_2O_3$, $Ga_2O_3$, and ZnO as starting materials in ethanol as a solvent; calcining the mixture at 1,000° C. for 2 hours; dry-pulverizing the resultant; and sintering the pulverized product at 1,550° C. for 2 hours. The target thus produced had an electric conductivity of 90 (S/cm).

Film formation was performed with the ultimate pressure in the growth chamber set to $2 \times 10^6$ (Pa) and an oxygen partial pressure during growth controlled to be 6.5 (Pa).

The oxygen partial pressure in the chamber 721 was 6.5 Pa and the substrate temperature was 25° C.

The distance between the target 708 and the deposition substrate 707 was 30 (mm), and the power of the KrF excimer laser incident from the entrance window 706 was in the range of 1.5 to 3 ($mJ/cm^2$/pulse). The pulse width, pulse rate, and irradiation spot diameter were set to 20 (nsec), 10 (Hz), and 1×1 (mm square), respectively.

Thus, film formation was performed at a film forming rate of 7 (nm/min).

X-ray diffraction was conducted on the resultant thin film by means of a small angle X-ray scattering method (SAXS) (thin film method, angle of incidence 0.5 degree). As a result, no clear diffraction peak was observed. Therefore, the produced In—Ga—Zn—O-based thin film can be said to be amorphous.

Furthermore, X-ray reflectance measurement was performed, and pattern analysis was performed. As a result, the thin film was found to have a mean square roughness (Rrms)

of about 0.5 nm and a thickness of about 120 nm. X-ray fluorescence (XRF) analysis confirmed that the metal composition ratio of the thin film was In:Ga:Zn=0.98:1.02:4.

The film had an electric conductivity of less than about $10^{-2}$ S/cm. The electron carrier concentration and electron mobility of the film are estimated to be about $10^{16}$/cm$^3$ or less and about 5 cm$^2$/(V·sec), respectively.

Owing to the analysis of a light absorption spectrum, the forbidden band energy width of the produced amorphous thin film was determined to be about 3 eV. The foregoing shows that the produced In—Ga—Zn—O-based thin film is a transparent and flat thin film showing an amorphous phase close to the composition of InGaO$_3$(ZnO)$_4$ as a crystal, having little oxygen defect, and having a small electric conductivity.

Specific description will be made with reference to FIG. 1. The figure shows the change of the electron carrier concentration of a transparent amorphous oxide thin film formed with changing oxygen partial pressure under the same conditions as those of this embodiment which is composed of In—Ga—Zn—O and has a composition in an assumed crystalline state represented by InGaO$_3$(ZnO)$_m$ (where m represents a number of less than 6).

Film formation was performed in an atmosphere having a high oxygen partial pressure in excess of 4.5 Pa under the same conditions as those of this embodiment. As a result, as shown in FIG. 1, it was able to reduce the electron carrier concentration to less than $10^{18}$/cm$^3$. In this case, the substrate had a temperature maintained at a temperature nearly equal to room temperature unless intentionally heated. The substrate temperature is preferably kept at a temperature lower than 100° C. in order to enable a flexible plastic film to be used as a substrate.

Additionally increasing the oxygen partial pressure can additionally reduce the electron carrier concentration. For example, as shown in FIG. 1, an InGaO$_3$(ZnO)$_4$ thin film formed at a substrate temperature of 25° C. and an oxygen partial pressure of 5 Pa had a number of electron carriers reduced to $10^{16}$/cm$^3$.

Figure 2:
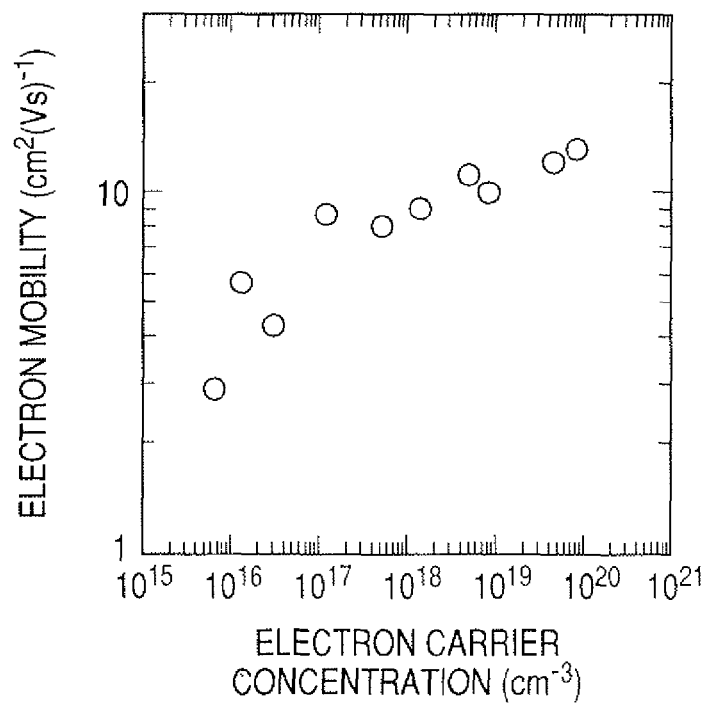
FIG. 2 is a graph showing a relationship between the electron carrier concentration and electron mobility of an In—Ga—Zn—O-based amorphous oxide film formed by means of a pulse laser deposition method.

As shown in FIG. 2, the resultant thin film had an electron mobility in excess of 1 cm$^2$/(V·sec). However, in the pulse laser deposition method of this example, when the oxygen partial pressure is 6.5 Pa or more, the surface of the deposited film becomes irregular, so it becomes difficult to use the film as a channel layer of a TFT.

Therefore, a normally-off transistor can be constituted by using a transparent amorphous oxide thin film having a composition in a crystalline state represented by InGaO$_3$(ZnO)$_m$ (where m represents a number of less than 6) by means of a pulse laser deposition method in an atmosphere having an oxygen partial pressure in excess of 4.5 Pa, or desirably in excess of 5 Pa and less than 6.5 Pa.

In addition, the thin film had an electron mobility in excess of 1 cm$^2$/V·sec, so the on-off ratio was able to exceed 10$^3$.

As described above, when an InGaZn oxide is formed into a film by means of the PLD method under the conditions shown in this embodiment, an oxygen partial pressure is desirably controlled to be 4.5 Pa or more and less than 6.5 Pa.

The realization of an electron carrier concentration of less than $10^{18}$/cm$^3$ depends on, for example, a condition of an oxygen partial pressure, the structure of a film forming apparatus, and a material and a composition to be formed into a film.

Figure 5:
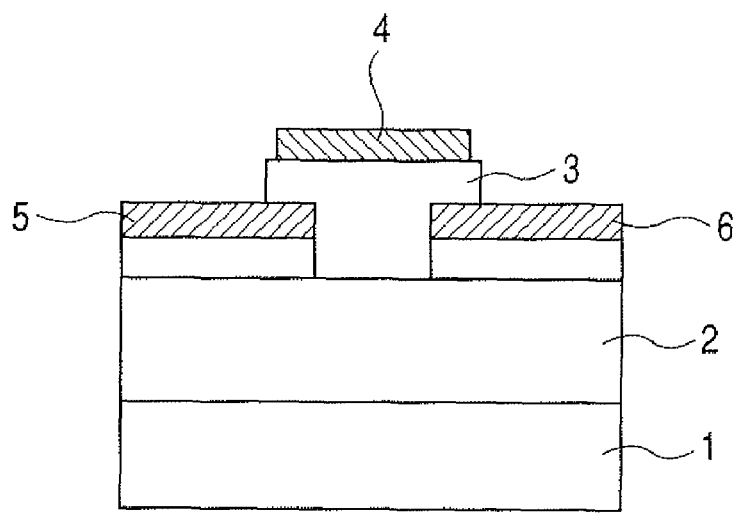
FIG. 5 is a schematic view showing a top gate TFT device structure.

Next, an amorphous oxide was produced at an oxygen partial pressure of 6.5 Pa in the above apparatus, and then a top gate MISFET device shown in FIG. 5 was produced. To be specific, at first, a semi-insulating amorphous InGaO$_3$(ZnO)$_4$ film having a thickness of 120 nm to be used as a channel layer (2) was formed on a glass substrate (1) by means of the above-described method of producing an amorphous In—Ga—Zn—O thin film.

Then, InGaO$_3$(ZnO)$_4$ and a gold film each having a large electric conductivity and a thickness of 30 nm were laminated on the film by means of a pulse laser deposition method with the oxygen partial pressure in the chamber set to be less than 1 Pa, to thereby form a drain terminal (5) and a source terminal (6) by means of a photolithography method and a lift-off method. Finally, a Y$_2$O$_3$ film to be used as a gate insulation film (3) (thickness: 90 nm, relative dielectric constant: about 15, leak current density: $10^{-3}$ A/cm$^2$ upon application of 0.5 MV/cm) was formed by means of an electron beam deposition method. A gold film was formed on the Y$_2$O$_3$ film, to thereby form a gate terminal (4) by means of a photolithography method and a lift-off method.

Evaluation of MISFET Device for Characteristics

Figure 6:
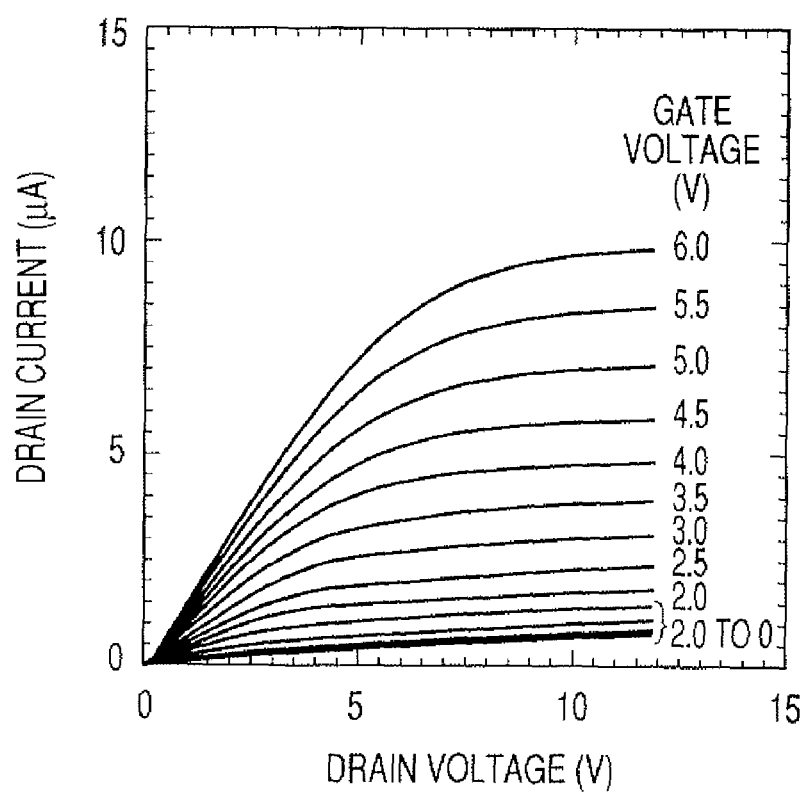
FIG. 6 is a graph showing the current-voltage characteristics of a top gate TFT device using $Y_2O_3$ for a gate insulation film.

FIG. 6 shows the current-voltage characteristics of an MISFET device measured at room temperature. The fact that a drain current I$_{DS}$ increased with increasing drain voltage V$_{DS}$ shows that the channel is an n-type semiconductor. This is not in contradiction to the fact that an amorphous In—Ga—Zn—O-based semiconductor is of an n-type. I$_{DS}$ saturated (pinched off) at V$_{DS}$ of about 6 V. The saturation is a typical behavior of a semiconductor transistor. Investigation into a gain characteristic showed that the threshold value for a gate voltage V$_{GS}$ was about –0.5 V upon application of V$_{DS}$=4 V. A current I$_{DS}$=1.0×10$^{-5}$ A flowed when V$_G$=10 V. This corresponds to the fact that a gate bias enabled a carrier to be induced in an In—Ga—Zn—O-based amorphous semiconductor thin film as an insulator.

The transistor had an on-off ratio in excess of 10$^3$. The field effect mobility was calculated from an output characteristic. As a result, a field effect saturation region. The produced device was irradiated with visible light to perform similar measurement. However, no changes in transistor characteristics were observed.

According to this embodiment, a thin film transistor having a channel layer with a small electron carrier concentration (that is, a high electrical resistance) and large electron mobility can be realized.

The above-described amorphous oxide had excellent properties. That is, electron mobility increased with increasing electron carrier concentration, and degenerate conduction was exhibited.

In this embodiment, a thin film transistor was formed on a glass substrate. A substrate such as a plastic plate or a film can also be used because film formation itself can be performed at room temperature.

In addition, the amorphous oxide obtained in this embodiment absorbs nearly no visible light and can realize a transparent and flexible TFT.

(Second Film Forming Method: Sputtering Method (SP Method))

Description will be given of film formation by means of a high-frequency SP method using an argon gas as an atmospheric gas.

Figure 10:
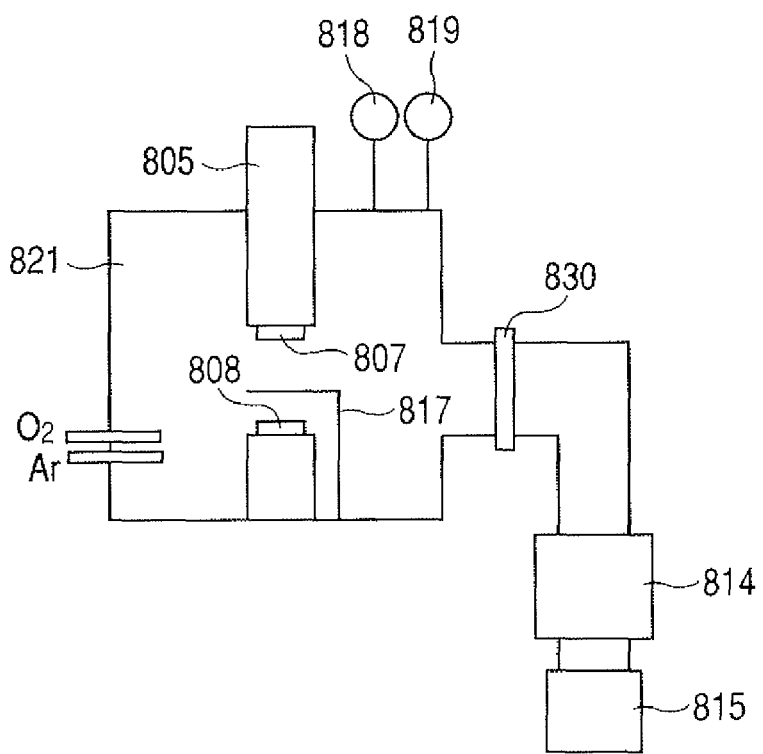
FIG. 10 is a schematic view showing a sputter film forming apparatus.

The SP method was performed by means of an apparatus shown in FIG. 10. In the figure, reference numeral 807 denotes a deposition substrate; 808, a target; 805, substrate holding means equipped with a cooling mechanism; 814, a turbo-molecular pump; 815, a rotary pump; 817, a shutter; 818, an ion vacuum gauge; 819, a Pirani vacuum gauge; 821, a growth chamber (chamber); and 830, a gate valve.

An SiO$_2$ glass substrate (1737 manufactured by Corning Inc.) was prepared as the deposition substrate 807. Prior to film formation, the substrate was subjected to degreasing washing by means of an ultrasonic wave for 5 minutes in each of acetone, ethanol, and ultrapure water, and was then dried in the air at 100° C.

A polycrystalline sintered material having an InGaO$_3$(ZnO)$_4$ composition (having a diameter of 20 mm and a thickness of 5 mm in size) was used for a target material.

The sintered material was produced by wet-mixing 4N reagents of In$_2$O$_3$, Ga$_2$O$_3$, and ZnO as starting materials in ethanol as a solvent; calcining the mixture at 1,000° C. for 2 hours; dry-pulverizing the resultant; and sintering the pulverized product at 1,550° C. for 2 hours. The target 808 had an electric conductivity of 90 (S/cm), and was in a semi-insulating state.

The ultimate pressure in the growth chamber 821 was 1×10$^{-4}$ (Pa) and the total pressure of an oxygen gas and the argon gas during growth was maintained at a constant value in the range of 4 to 0.1×10$^{-4}$ (Pa). Then, the ratio between the partial pressure of the argon gas and the oxygen partial pressure was varied to change the oxygen partial pressure in the range of 10$^{-3}$ to 2×10$^{-1}$ (Pa).

In addition, the substrate temperature was set to be room temperature, and the distance between the target 808 and the deposition substrate 807 was 30 (mm).

Supplied power was RF180 W, and film formation was performed at a film forming rate of 10 (nm/min).

X-ray diffraction was conducted on the resultant film by means of a small angle X-ray scattering method (SAXS) (thin film method, angle of incidence 0.5 degree). As a result, no clear diffraction peak was detected. Therefore, the produced In—Zn—Ga—O-based film was found to be an amorphous film.

Furthermore, X-ray reflectance measurement was performed, and pattern analysis was performed. As a result, the thin film was found to have a mean square roughness (Rrms) of about 0.5 nm and a thickness of about 120 nm. X-ray fluorescence (XRF) analysis confirmed that the metal composition ratio of the thin film was In:Ga:Zn=0.98:1.02:4.

Figure 3:
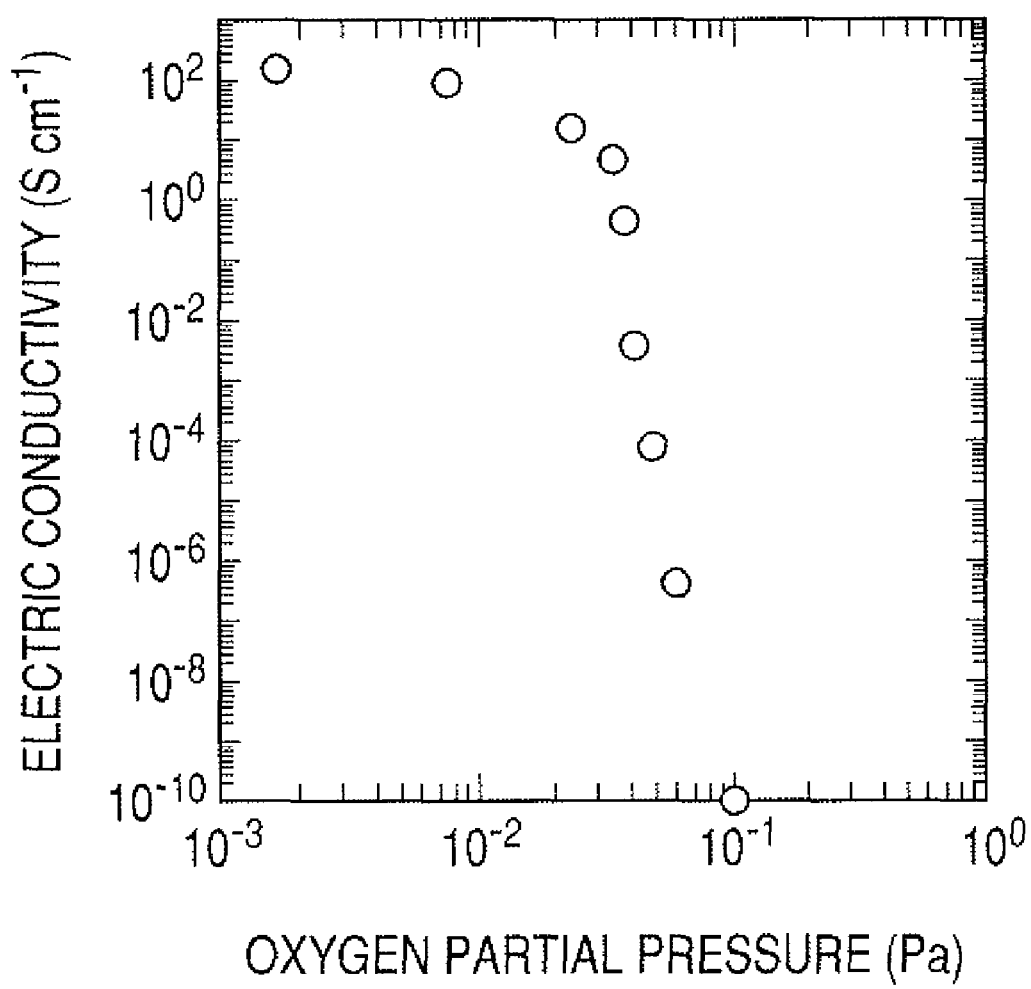
FIG. 3 is a graph showing a relationship between the electric conductivity of an In—Ga—Zn—O-based amorphous oxide film formed by means of a high-frequency sputtering method using an argon gas and an oxygen partial pressure upon film formation.

The electric conductivity of the amorphous oxide film obtained was measured with the oxygen partial pressure of the atmosphere during film formation changed. FIG. 3 shows the results.

As shown in FIG. 3, film formation in an atmosphere having a high oxygen partial pressure in excess of 3×10$^{-2}$ Pa was able to reduce an electric conductivity to less than 10 S/cm.

Additionally increasing the oxygen partial pressure was able to reduce the number of electron carriers.

For example, as shown in FIG. 3, an InGaO$_3$(ZnO)$_4$ thin film formed at a substrate temperature of 25° C. and an oxygen partial pressure of 10$^{-1}$ Pa had an electric conductivity additionally reduced to about 10$^{-10}$ S/cm. In addition, an InGaO$_3$(ZnO)$_4$ thin film formed at an oxygen partial pressure in excess of 10$^{-1}$ Pa had so high an electrical resistance that its electric conductivity could not be measured. In this case, the electron mobility, which could not be measured, was estimated to be about 1 cm$^2$/V·sec as a result of extrapolation from a value in a film having a large electron carrier concentration.

That is, it was able to constitute a normally-off transistor having an on-off ratio in excess of 10$^3$ by using a transparent amorphous oxide thin film constituted by In—Ga—Zn—O produced by means of a sputtering deposition method in an argon gas atmosphere having an oxygen partial pressure in excess of 3×10$^{-2}$ Pa, or desirably in excess of 5×10$^1$ Pa and having a composition in a crystalline state represented by InGaO$_3$(ZnO)$_n$ (where m represents a natural number of less than 6).

When the apparatus and the material shown in this embodiment are used, the oxygen partial pressure upon film formation by means of sputtering is, for example, in the range of 3×10$^{-2}$ Pa to 5×10$^{-1}$ Pa (both inclusive). As shown in FIG. 2, the electron mobility increases with increasing number of conduction electrons in a thin film produced by means of each of the pulse laser deposition method and the sputtering method.

As described above, controlling an oxygen partial pressure can reduce the number of oxygen defects, thereby reducing an electron carrier concentration. In addition, in an amorphous state, unlike a polycrystalline state, substantially no particle interface is present, so an amorphous thin film having a high electron mobility can be obtained.

It should be noted that an InGaO$_3$(ZnO)$_4$ amorphous oxide film obtained by using a polyethylene terephthalate (PET) film having a thickness of 200 μm instead of a glass substrate also showed similar characteristics.

The use of a polycrystal InGaO$_2$(Zn$_{1-x}$Mg$_x$O)$_m$ (where m represents a natural number of less than 6 and 0<x≦1) as a target can provide a high-resistance amorphous InGaO$_3$(Zn$_{1-x}$Mg$_x$O)$_m$ film even at an oxygen partial pressure of less than 1 Pa.

For example, when a target obtained by substituting Zn by 80 at. % of Mg is used, the electron carrier concentration of a film obtained by means of a pulse laser deposition method in an atmosphere having an oxygen partial pressure of 0.8 Pa can be less than 10$^{16}$/cm$^3$ (the electrical resistance is about 10$^{-2}$ S/cm).

The electron mobility of such film reduces as compared to a film with no additional Mg, but the degree of the reduction is small: the electron mobility at room temperature is about 5 cm$^2$/(V·sec), which is about one order of magnitude larger than that of amorphous silicon. Upon film formation under the same conditions, the electric conductivity and the electron mobility reduce with increasing Mg content. Therefore, the Mg content is preferably in excess of 20% and less than 85% (that is, 0.2<x<0.85).

In the thin film transistor using the above-described amorphous oxide film, one of Al$_2$O$_3$, Y$_2$O$_3$, and HfO$_2$, or a mixed crystal compound containing at least two kinds of these compounds is preferably used for a gate insulation film.

When a defect is present in an interface between the gate insulation thin film and the channel layer thin film, electron mobility reduces and hysteresis occurs in transistor characteristics. In addition, a leak current varies to a large extent depending on the kind of the gate insulation film. Therefore, a gate insulation film suitable for a channel layer needs to be selected. The use of an Al$_2$O$_3$ film can reduce a leak current. In addition, the use of a Y$_2$O$_3$ film can reduce hysteresis. Furthermore, the use of an HfO$_2$ film having a high dielectric constant can increase electron mobility. In addition, the use of those films can result in the formation of a TFT having a small leak current, small hysteresis, and a large electron mobility. In addition, each of a gate insulation film forming process and a channel layer forming process can be performed at room temperature, so each of a staggered structure and an inversely staggered structure can be formed as a TFT structure.

The TFT thus formed is a three-terminal device equipped with a gate terminal, a source terminal, and a drain terminal, and is an active device which uses a semiconductor thin film formed on an insulating substrate such as a ceramic, glass, or plastic as a channel layer in which an electron or a hole moves, and provides a switching function for a current between the source terminal and the drain terminal by applying a voltage to the gate terminal to control a current flowing in the channel layer.

The fact that a desired electron carrier concentration can be achieved by controlling an oxygen defective amount is important in the present invention.

In the foregoing description, the amount of oxygen in an amorphous oxide film (oxygen defective amount) is controlled in an atmosphere containing a predetermined concentration of oxygen upon film formation. It is also preferable to control (reduce or increase) the oxygen defective amount by subjecting the oxide film to a post treatment in an atmosphere containing oxygen after the film formation.

To effectively control the oxygen defective amount, the temperature in the atmosphere containing oxygen is in the range of desirably 0° C. to 300° C. (both inclusive), preferably 25° C. to 250° C. (both inclusive), or more preferably 100° C. to 200° C. (both inclusive).

Of course, the oxygen defective amount may be controlled in the atmosphere containing oxygen upon film formation and then controlled through a post treatment in the atmosphere containing oxygen after the film formation. In addition, the oxygen partial pressure may be controlled not upon film formation but after the film formation through a post treatment in the atmosphere containing oxygen as long as a desired electron carrier concentration (less than $10^{18}/cm^3$) can be obtained.

The lower limit for the electron carrier concentration in the present invention, which varies depending on what kind of device, circuit, or apparatus an oxide film to be obtained is used for, is, for example, $10^{14}/cm^3$ or higher.

(Expansion of Material System)

As a result of research on an expanded composition system, it has been found that an amorphous oxide film having a small electron carrier concentration and a large electron mobility can be produced by means of an amorphous oxide composed of an oxide of at least one element of Zn, In, and Sn.

It has also been found that the amorphous oxide film has a specific property with which the electron mobility increases with increasing number of conduction electrons.

A normally-off TFT excellent in transistor characteristics including on-off ratio, saturation current in a pinch-off state, and switching speed can be produced by means of the film.

An oxide having any one of the following characteristics (a) to (h) can be used in the present invention.

(a) An amorphous oxide having an electron carrier concentration of less than $10^{18}/cm^3$ at room temperature.

(b) An amorphous oxide whose electron mobility increases with increasing electron carrier concentration.

The term "room temperature" as used herein refers to a temperature of about 0° C. to 40° C. The term "amorphous" as used herein refers to a compound having only a halo pattern to be observed, and showing no specific diffraction ray, in an X-ray diffraction spectrum. The term "electron mobility" as used herein refers to an electron mobility measured through Hall effect measurement.

(c) An amorphous oxide according to the above item (a) or (b) having an electron mobility in excess of 0.1 cm²/V·sec at room temperature.

(d) An amorphous oxide according to the above item (b) or (c) exhibiting degenerate conduction. The term "degenerate conduction" as used herein refers to a state where thermal activation energy in the temperature dependence of an electrical resistance is 30 meV or less.

(e) An amorphous oxide according any one of the above items (a) to (d) containing at least one element of Zn, In, and Sn as a constituent.

(f) An amorphous oxide film obtained by incorporating, into the amorphous oxide according to the above item (e), at least one element of a Group II element M2 having an atomic number smaller than that of Zn (M2 represents Mg or Ca); a Group III element M3 having an atomic number smaller than that of In (M3 represents B, Al, Ga, or Y); a Group IV element M4 having an atomic number smaller than that of Sn (M4 represents Si, Ge, or Zr); a Group V element M5 (M5 represents V, Nb, or Ta); and Lu and W.

(g) An amorphous oxide film according to any one of the above items (a) to (f), which is a single compound having a composition in a crystalline state represented by $In_{2-x}M3_xO_3(Zn_{1-y}M2_yO)_m$ (where $0<x\leq2$, $0\leq1y\leq1$ and m represents 0 or a natural number of less than 6) or a mixture of compounds having different m's. M3 represents Ga or the like, and M2 represents Mg or the like.

(h) An amorphous oxide film according to any one of the above items (a) to (g) which is arranged on a glass substrate, a metal substrate, a plastic substrate, or a plastic film.

The present invention relates to a field effect transistor using the amorphous oxide or amorphous oxide film described above for a channel layer.

An amorphous oxide film having an electron carrier concentration in excess of $10^{15}/cm^3$ and less than $10^{18}/cm^3$ is used for a channel layer to constitute a field effect transistor in which a source terminal, a drain terminal, and a gate terminal are arranged via a gate insulation film. When a voltage of about 5 V is applied between the source and drain terminals, a current between the source and drain terminals with no gate voltage applied can be about $10^{-7}$ A.

The electron mobility of an oxide crystal increases as the degree to which the s orbitals of metal ions overlap with each other increases. The oxide crystal of Zn, In, or Sn having a large atomic number has a large electron mobility of 0.1 to 200 cm²/(V·sec).

Furthermore, in the oxide, oxygen and a metal ion bond to each other through an ionic bond.

As a result, even in an amorphous state in which a chemical bond has no directivity, a structure is random, and the direction of bonding is non-uniform, the electron mobility can be comparable to the electron mobility in a crystalline state.

On the other hand, replacing Zn, In, or Sn with an element having a small atomic number reduces the electron mobility. As a result, the electron mobility of the amorphous oxide according to the present invention is about 0.01 cm²/(V·sec) to 20 cm²/(V·sec).

When a channel layer of a transistor is produced by means of the above-described oxide, one of $Al_2O_3$, $Y_2O_3$, and $HfO_2$, or a mixed crystal compound containing at least two kinds of these compounds is preferably used for a gate insulation film.

When a defect is present in an interface between the gate insulation thin film and the channel layer thin film, electron mobility reduces and hysteresis occurs in transistor characteristics. In addition, leak current varies to a large extent depending on the kind of the gate insulation film. Therefore, a gate insulation film suitable for a channel layer needs to be selected. The use of an $Al_2O_3$ film can reduce leak current. In addition, the use of a $Y_2O_3$ film can reduce hysteresis. Furthermore, the use of an $HfO_2$ film having a high dielectric constant can increase field effect mobility. In addition, the use of a film composed of a mixed crystal of those compounds can result in the formation of a TFT having a small leak current, small hysteresis, and a large field effect mobility. In addition, each of a gate insulation film forming process and a channel layer forming process can be performed at room temperature, so each of a staggered structure and an inversely staggered structure can be formed as a TFT structure.

An $In_2O_3$ oxide film can be formed by means of a vapor phase method, and an amorphous film can be obtained by adding about 0.1 Pa of water to an atmosphere during film formation.

Although an amorphous film is hardly obtained from each of ZnO and $SnO_2$, an amorphous film can be obtained by adding about 20 at. % of $In_2O_2$ to ZnO or by adding about 90 at. % of $In_2O_2$ to $SnO_2$. In particular, about 0.1 Pa of a nitrogen gas is desirably introduced into the atmosphere in order to obtain an Sn—In—O-based amorphous film.

The above amorphous film can have an additional element constituting a composite oxide of at least one element of: a Group II element M2 having an atomic number smaller than that of Zn (M2 represents Mg or Ca); a Group III element M3 having an atomic number smaller than that of In (M3 represents B, Al, Ga, or Y); a Group IV element M4 having an atomic number smaller than that of Sn (M4 represents Si, Ge, or Zr); a Group V element M5 (M5 represents V, Nb, or Ta); and Lu and W.

The additional element can additionally stabilize the amorphous film at room temperature. In addition, the addition can expand the composition range in which the amorphous film can be obtained.

In particular, the addition of B, Si, or Ge having strong covalency is effective in stabilizing an amorphous phase, and a composite oxide composed of ions different from each other in ionic radius to a large extent has a stabilized amorphous phase.

For example, a stable amorphous film is hardly obtained at room temperature unless In accounts for more than about 20 at. % of an In—Zn—O system. However, the addition of Mg in an amount equivalent to that of In can provide a stable amorphous film when In accounts for more than about 15 at. %.

An amorphous oxide film having an electron carrier concentration in excess of $10^{15}/cm^3$ and less than $10^{18}/cm^3$ can be obtained by controlling an atmosphere in film formation by means of a vapor phase method.

An amorphous oxide is desirably formed into a film by means of any one of the vapor phase methods such as a pulse laser deposition method (PLD method), a sputtering method (SP method), and an electron beam deposition method. Of those vapor phase methods, a PLD method is suitable because the composition of a material system can be easily controlled, and an SP method is suitable in terms of mass productivity. However, a film forming method is not limited to those methods.

(Formation of In—Zn—Ga—O-Based Amorphous Oxide Film by Means of PLD Method)

Polycrystalline sintered materials each having an $InGaO_3$(ZnO) composition or an $InGaO_3(ZnO)_4$ composition were used as targets to deposit an In—Zn—Ga—O-based amorphous oxide film on a glass substrate (1737 manufactured by Corning Inc.) by means of a PLD method using a KrF excimer laser.

The film forming apparatus used was that shown in FIG. 9 describe above, and film forming conditions were the same as those in the case where the apparatus was used.

The substrate temperature was 25° C. X-ray diffraction was conducted on each of the resultant films by means of a small angle X-ray scattering method (SAXS) (thin film method, angle of incidence 0.5 degree). As a result, no clear diffraction peak was detected. Therefore, each of the In—Zn—Ga—C-based films produced from two kinds of targets was found to be an amorphous film.

Furthermore, X-ray reflectance measurement was performed on each of the In—Zn—Ga—O-based amorphous oxide films on the glass substrate, and pattern analysis was performed. As a result, each of the thin films was found to have a mean square roughness (Rrms) of about 0.5 nm and a thickness of about 120 nm.

X-ray fluorescence (XRF) analysis confirmed that the metal composition ratio of the film obtained by using the polycrystalline sintered material having the $InGaO_3$(ZnO) composition as a target was In:Ga:Zn=1.1:1.1:0.9 and the metal composition ratio of the film obtained by using the polycrystalline sintered material having the $InGaO_3(ZnO)_4$ composition as a target was In:Ga:Zn=0.98:1.02:4.

The electron carrier concentration of the amorphous oxide film obtained by using the polycrystalline sintered material having the $InGaO_3(ZnO)_4$ composition as a target was measured with the oxygen partial pressure of the atmosphere during film formation changed. FIG. 1 shows the results. Film formation in an atmosphere having an oxygen partial pressure in excess of 4.2 Pa was able to reduce the electron carrier concentration to less than $10^{18}/cm^3$. In this case, the substrate had a temperature maintained at a temperature nearly equal to room temperature unless intentionally heated. When the oxygen partial pressure was less than 6.5 Pa, the surface of the resultant amorphous oxide film was flat.

When the oxygen partial pressure was 5 Pa, the amorphous oxide film obtained by using the polycrystalline sintered material having the $InGaO_3(ZnO)_4$ composition as a target had an electron carrier concentration of $10^{16}/cm^3$ and an electric conductivity of $10^2$ S/cm. In addition, its electron mobility was estimated to be about 5 $cm^2$/V·sec. Owing to the analysis of a light absorption spectrum, the forbidden band energy width of the produced amorphous oxide film was determined to be about 3 eV.

Additionally increasing the oxygen partial pressure was able to additionally reduce the electron carrier concentration. As shown in FIG. 1, an In—Zn—Ga—O-based amorphous oxide film formed at a substrate temperature of 25° C. and an oxygen partial pressure of 6 Pa had an electron carrier concentration reduced to $8 \times 10^{15}/cm^3$ (electric conductivity: about $8 \times 10^{-3}$ S/cm). The electron mobility of the resultant film was estimated to be in excess of 1 $cm^2$/(V·sec). However, in the PLD method, when the oxygen partial pressure was 6.5 Pa or more, the surface of the deposited film became irregular, so it became difficult to use the film as a channel layer of a TFT.

Investigation was made into the relationship between the electron carrier concentration and electron mobility of each of In—Zn—Ga—O-based amorphous oxide films formed at different oxygen partial pressures by using the polycrystalline sintered material having the $InGaO_3(ZnO)_4$ composition as a target. FIG. 2 shows the results. It was found that the electron mobility increased from about 3 $cm^2$/(V·sec) to about 11 $cm^2$/(V·sec) as the electron carrier concentration increased from $10^{16}/cm^2$ to $10^{20}/cm^2$. A similar tendency was observed in an amorphous oxide film obtained by using the polycrystalline sintered material having the $InGaO_3$(ZnO) composition as a target.

An In—Zn—Ga—O-based amorphous oxide film obtained by using a polyethylene terephthalate (PET) film having a thickness of 200 μm instead of a glass substrate also showed similar characteristics.

(Formation of In—Zn—Ga—Mg—O-Based Amorphous Oxide Film by Means of PLD Method)

A polycrystal $InGaO_3(Zn_{1-x}Mg_xO)_4$ ($0<x\leq1$) was used as a target to form an $InGaO_3(Zn_{1-x}Mg_xO)_4$ ($0<x\leq1$) film on a glass substrate by means of the PLD method.

The apparatus shown in FIG. 9 was used as a film forming apparatus.

An SiO$_2$ glass substrate (1737 manufactured by Corning Inc.) was prepared as a deposition substrate. The substrate was subjected to degreasing washing by means of an ultrasonic wave for 5 minutes in each of acetone, ethanol, and ultrapure water as a pretreatment, and was then dried in the air at 100° C. An InGa(Zn$_{1-x}$Mg$_x$O)$_4$ (x=1 to 0) sintered material (having a diameter of 20 mm and a thickness of 5 mm in size) was used as a target.

The target was produced by wet-mixing 4N reagents of In$_2$O$_3$, Ga$_2$O$_3$, ZnO, and MgO as starting materials in ethanol as a solvent; calcining the mixture at 1,000° C. for 2 hours; dry-pulverizing the resultant; and sintering the pulverized product at 1,550° C. for 2 hours.

The ultimate pressure in the growth chamber was $2 \times 10^6$ (Pa), and the oxygen partial pressure during growth was set to be 0.8 (Pa). The substrate temperature was room temperature (25° C.), and the distance between the target and the deposition substrate was 30 (mm).

The KrF excimer laser had a power of 1.5 (mJ/cm$^2$/pulse), a pulse width of 20 (nsec), a pulse rate of 10 (Hz), and an irradiation spot diameter of 1×1 (mm square).

The film forming rate was 7 (nm/min).

The oxygen partial pressure of the atmosphere was 0.8 Pa, and the substrate temperature was 25° C. X-ray diffraction was conducted on the resultant film by means of a small angle X-ray scattering method (SAXS) (thin film method, angle of incidence 0.5 degree). As a result, no clear diffraction peak was detected. Therefore, the produced In—Zn—Ga—Mg—O-based film was found to be an amorphous film. The surface of the resultant film was flat.

Targets having different values of x were used to determine the x value dependence of each of the electric conductivity, electron carrier concentration, and electron mobility of the In—Zn—Ga—Mg—O-based amorphous oxide film formed in an atmosphere having an oxygen partial pressure of 0.8 Pa.

Figure 4:
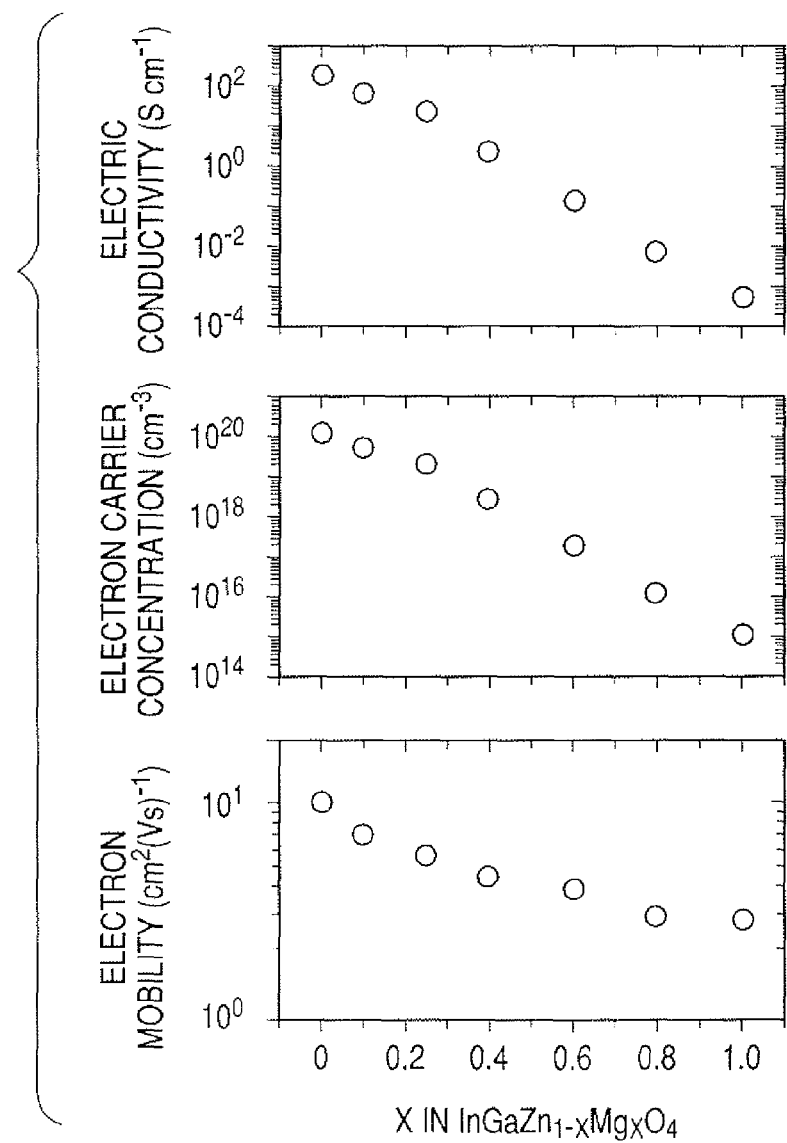
FIG. 4 shows graphs showing changes in electric conductivity, electron carrier concentration, and electron mobility with the value for x of $InGaO_3(Zn_{1-x}Mg_xO)_4$ formed into a film by means of a pulse laser deposition method in an atmosphere having an oxygen partial pressure of 0.8 Pa.

FIG. 4 shows the results. When the value of x exceeded 0.4, the electron carrier concentration of an amorphous oxide film formed by means of the PLD method in an atmosphere having an oxygen partial pressure of 0.8 Pa was less than $10^{18}$/cm$^3$. In addition, an amorphous oxide film having a value of x in excess of 0.4 had an electron mobility in excess of 1 cm$^2$/V·sec.

As shown in FIG. 4, when a target obtained by substituting Zn by 80 at. % of Mg is used, the electron carrier concentration of a film obtained by means of a pulse laser deposition method in an atmosphere having an oxygen partial pressure of 0.8 Pa can be less than $10^{16}$/cm$^3$ (the electrical resistance is about $10^{-2}$ S/cm). The electron mobility of such film reduces as compared to a film with no additional Mg, but the degree of the reduction is small: the electron mobility at room temperature is about 5 cm$^2$/(V·sec), which is about one order of magnitude larger than that of amorphous silicon. Upon film formation under the same conditions, the electric conductivity and the electron mobility reduce with increasing Mg content. Therefore, the Mg content is preferably in excess of 20 at. % and less than 85 at. % (that is, 0.2<x<0.85), more preferably 0.5<x<0.85.

An InGaO$_2$(Zn$_{1-x}$Mg$_x$O)$_4$ (0<x≦1) amorphous oxide film obtained by using a polyethylene terephthalate (PET) film having a thickness of 200 µm instead of a glass substrate also showed similar characteristics.

(Formation of In$_2$O$_3$ Amorphous Oxide Film by Means of PLD Method)

An In$_2$O$_3$ polycrystalline sintered material was used as a target to form an In$_2$O$_3$ film on a PET film having a thickness of 200 µm by means of the PLD method using a KrF excimer laser. The apparatus shown in FIG. 9 was used. An SiO$_2$ glass substrate (1737 manufactured by Corning Inc.) was prepared as a deposition substrate.

The substrate was subjected to degreasing washing by means of an ultrasonic wave for 5 minutes in each of acetone, ethanol, and ultrapure water as a pretreatment, and was then dried in the air at 100° C.

An In$_2$O$_3$ sintered material (having a diameter of 20 mm and a thickness of 5 mm in size) was used as a target. The target was prepared by calcining a 4N reagent of In$_2$O$_3$ as a starting material at 1,000° C. for 2 hours; dry-pulverizing the resultant; and sintering the pulverized product at 1,550° C. for 2 hours.

The ultimate pressure in the growth chamber was $2 \times 10^6$ (Pa), and the oxygen partial pressure during growth and the substrate temperature were set to be 5 (Pa) and room temperature, respectively.

The oxygen partial pressure and the vapor partial pressure were set to be 5 Pa and 0.1 Pa, respectively, and 200 W was applied to an oxygen-radical-generating apparatus to generate an oxygen radical.

The distance between the target and the deposition substrate was 40 (mm). The KrF excimer laser had a power of 0.5 (mJ/cm$^2$/pulse), a pulse width of 20 (nsec), a pulse rate of 10 (Hz), and an irradiation spot diameter of 1×1 (mm square).

The film forming rate was 3 (nm/min).

X-ray diffraction was conducted on the resultant film by means of a small angle X-ray scattering method (SAXS) (thin film method, angle of incidence 0.5 degree). As a result, no clear diffraction peak was detected. Therefore, the produced In—O-based film was found to be an amorphous film. The film had a thickness of 80 nm.

The resultant In—O-base amorphous oxide film had an electron carrier concentration of $5 \times 10^{17}$/cm$^2$ and an electron mobility of about 7 cm$^2$/V·sec.

(Formation of In—Sn—O-Based Amorphous Oxide Film by Means of PLD Method)

An (In$_{0.9}$Sn$_{0.1}$)O$_{3.1}$ polycrystalline sintered material was used as a target to form an In—Sn—O-based oxide film on a PET film having a thickness of 200 µm by means of the PLD method using a KrF excimer laser.

To be specific, an SiO$_2$ glass substrate (1737 manufactured by Corning Inc.) was prepared as a deposition substrate.

The substrate was subjected to degreasing washing by means of an ultrasonic wave for 5 minutes in each of acetone, ethanol, and ultrapure water as a pretreatment, and was then dried in the air at 100° C.

An In$_2$O$_3$—SnO$_2$ sintered material (having a diameter of 20 mm and a thickness of 5 mm in size) was prepared as a target. The target was produced by wet-mixing a 4N reagent of In$_2$O$_3$—SnO$_2$ as a starting material in ethanol as a solvent; calcining the mixture at 1,000° C. for 2 hours; dry-pulverizing the resultant; and sintering the pulverized product at 1,550° C. for 2 hours.

The substrate temperature was room temperature. The oxygen partial pressure and the nitrogen partial pressure were set to be 5 (Pa) and 0.1 (Pa), respectively, and 200 W was applied to an oxygen-radical-generating apparatus to generate an oxygen radical.

The distance between the target and the deposition substrate was 30 (mm). The KrF excimer laser had a power of 1.5 (mJ/cm$^2$/pulse), a pulse width of 20 (nsec), a pulse rate of 10 (Hz), and an irradiation spot diameter of 1×1 (mm square).

The film forming rate was 6 (nm/min).

X-ray diffraction was conducted on the resultant film by means of a small angle X-ray scattering method (SAXS) (thin film method, angle of incidence 0.5 degree). As a result, no clear diffraction peak was detected. Therefore, the produced In—Sn—C-based film was found to be an amorphous film.

The resultant In—Sn—C amorphous oxide film had an electron carrier concentration of $8\times10^{17}/cm^3$, an electron mobility of about 5 $cm^2/V\cdot sec$, and a thickness of 100 nm.

(Formation of In—Ga—O-Based Amorphous Oxide Film by Means of PLD Method)

An $SiO_2$ glass substrate (1737 manufactured by Corning Inc.) was prepared as a deposition substrate.

The substrate was subjected to degreasing washing by means of an ultrasonic wave for 5 minutes in each of acetone, ethanol, and ultrapure water as a pretreatment, and was then dried in the air at 100° C.

An $(In_2O_3)_{1-x}$—$(Ga_2O_3)_x$ (x=0 to 1) sintered material (having a diameter of 20 mm and a thickness of 5 mm in size) was prepared as a target. For example, in the case of x=0.1, the target is $(In_{0.9}Ga_{0.1})_2O_3$ polycrystalline sintered material.

The target was produced by wet-mixing a 4N reagent of $In_2O_3$—$Ga_2O_2$ as a starting material in ethanol as a solvent; calcining the mixture at 1,000° C. for 2 hours; dry-pulverizing the resultant; and sintering the pulverized product at 1,550° C. for 2 hours.

The ultimate pressure in the growth chamber was $2\times10^{-6}$ (Pa), and the oxygen partial pressure during growth was set to be 1 (Pa).

The substrate temperature was room temperature. The distance between the target and the deposition substrate was 30 (mm). The KrF excimer laser had a power of 1.5 ($mJ/cm^2$/pulse), a pulse width of 20 (nsec), a pulse rate of 10 (Hz), and an irradiation spot diameter of 1×1 (mm square). The film forming rate was 6 (nm/min).

The substrate temperature was 25° C. The oxygen partial pressure was 1 Pa. X-ray diffraction was conducted on the resultant film by means of a small angle X-ray scattering method (SAXS) (thin film method, angle of incidence 0.5 degree). As a result, no clear diffraction peak was detected. Therefore, the produced In—Ga—O-based film was found to be an amorphous film. The film had a thickness of 120 nm.

The resultant In—Ga—O amorphous oxide film had an electron carrier concentration of $8\times10^{16}/cm^3$ and an electron mobility of about 1 $cm^2/V\cdot sec$.

(Production of TFT Device Using In—Zn—Ga—O-Based Amorphous Oxide Film (Glass Substrate))

Production of TFT Device

A top gate TFT device shown in FIG. 5 was produced.

At first, a polycrystalline sintered material having an $InGaO_3(ZnO)_4$ composition was used as a target to form an In—Ga—Zn—O-based amorphous oxide film on a glass substrate (1) at an oxygen partial pressure of 5 Pa by means of the above-described PLD apparatus. Thus, an In—Ga—Zn—O-based amorphous film having a thickness of 120 nm to be used as a channel layer (2) was formed.

An In—Ga—Zn—O-based amorphous film and a gold film each having a large electric conductivity and a thickness of 30 nm were laminated on the film by means of the PLD method with the oxygen partial pressure in the chamber set to be less than 1 Pa, to thereby form a drain terminal (5) and a source terminal (6) by means of a photolithography method and a lift-off method.

Finally, a $Y_2O_3$ film to be used as a gate insulation film (3) (thickness: 90 nm, relative dielectric constant: about 15, leak current density: $10^{-3}$ $A/cm^2$ upon application of 0.5 MV/cm) was formed by means of an electron beam deposition method. A gold film was formed on the $Y_2O_3$ film, to thereby form a gate terminal (4) by means of a photolithography method and a lift-off method. The channel length was 50 μm and the channel width was 200 μm.

Evaluation of TFT Device for Characteristics

FIG. 6 shows the current-voltage characteristics of a TFT device measured at room temperature. The fact that a drain current $I_{DS}$ increased with increasing drain voltage $V_{DS}$ shows that the conduction of the channel is of an n-type.

This is not in contradiction to the fact that an amorphous In—Ga—Zn—O-based amorphous oxide film is an n-type conductor. $I_{DS}$ saturated (pinched off) at $V_{DS}$ of about 6 V. The saturation is a typical behavior of a semiconductor transistor. Investigation into a gain characteristic showed that the threshold value for a gate voltage $V_{DS}$ was about -0.5 V upon application of $V_{DS}$=4 V.

A current $I_{DS}$=1.0×10$^{-5}$ A flowed when $V_G$=10 V. This corresponds to the fact that a gate bias enabled a carrier to be induced in an In—Ga—Zn—O-based amorphous oxide film as an insulator.

The transistor had an on-off ratio in excess of $10^3$. The field effect mobility was calculated from an output characteristic. As a result, a field effect mobility of about 7 $cm^2(Vs)^{-1}$ was obtained in a saturation region. The produced device was irradiated with visible light to perform similar measurement. However, no changes in transistor characteristics were observed.

An amorphous oxide having an electron carrier concentration of less than $10^{18}/cm^3$ is applicable to a channel layer of a TFT. The electron carrier concentration was more preferably $10^{17}/cm^3$ or less, or still more preferably $10^{16}/cm^3$ or less.

(Production of TFT Device Using In—Zn—Ga—O-Based Amorphous Oxide Film (Amorphous Substrate))

A top gate TFT device shown in FIG. 5 was produced. At first, a polycrystalline sintered material having an $InGaO_3$(ZnO) composition was used as a target to form an In—Zn—Ga—O-based amorphous oxide film having a thickness of 120 nm to be used as a channel layer (2) on a polyethylene terephthalate (PET) film (1) at an oxygen partial pressure of 5 Pa by means of the PLD method.

An In—Zn—Ga—O-based amorphous oxide film and a gold film each having a large electric conductivity and a thickness of 30 nm were laminated on the film by means of the PLD method with the oxygen partial pressure in the chamber set to be less than 1 Pa, to thereby form a drain terminal (5) and a source terminal (6) by means of a photolithography method and a lift-off method. Finally, a gate insulation film (3) was formed by means of an electron beam deposition method, and a gold film was formed on the film to thereby form a gate terminal (4) by means of a photolithography method and a lift-off method. The channel length was 50 μm and the channel width was 200 μm. Each of $Y_2O_3$ (thickness: 140 nm), $Al_2O_3$ (thickness: 130 μm), and $HfO_2$ (thickness: 140 μm) was used as a gate insulation film to produce three kinds of TFT's each having the above structure.

Evaluation of TFT Device for Characteristics

The current-voltage characteristics of a TFT formed on the PET film measured at room temperature were the same as those shown in FIG. 6. That is, the fact that a drain current $I_{DS}$ increased with increasing drain voltage $V_{DS}$ shows that the conduction of the channel is of an n-type. This is not in contradiction to the fact that an amorphous In—Ga—Zn—O-based amorphous oxide film is an n-type conductor. $I_{DS}$ saturated (pinched off) at $V_{DS}$ of about 6 V. The saturation is a typical behavior of a transistor. A current $I_{ds}$=10$^{-8}$ A flowed when $V_g$=0, while a current $I_{DS}$=2.0×10$^{-5}$ A flowed when $V_g$=10 V. This corresponds to the fact that a gate bias enabled an electron carrier to be induced in an In—Ga—Zn—O-based amorphous oxide film as an insulator.

The transistor had an on-off ratio in excess of $10^3$. The field effect mobility was calculated from an output characteristic.

As a result, a field effect mobility of about 7 cm$^2$(Vs)$^1$ was obtained in a saturation region.

The device produced on the PET film was bent at a radius of curvature of 30 mm to perform similar measurement of transistor characteristics. However, no changes in transistor characteristics were observed. The device was irradiated with visible light to perform similar measurement. However, no changes in transistor characteristics were observed.

The TFT using an Al$_2$O$_3$ film as a gate insulation film showed transistor characteristics similar to those shown in FIG. 6. A current I$_{ds}$=10$^{-8}$ A flowed when V$_g$=0, while a current I$_{DS}$=5.0×10$^{-6}$ A flowed when V$_g$=10 V. The transistor had an on-off ratio in excess of 10$^2$. The field effect mobility was calculated from an output characteristic. As a result, a field effect mobility of about 2 cm$^2$(Vs)$^{-1}$ was obtained in a saturation region.

The TFT using an HfO$_2$ film as a gate insulation film showed transistor characteristics similar to those shown in FIG. 6. A current I$_{ds}$=10$^{-8}$ A flowed when V$_g$=0, while a current I$_{DS}$=1.0×10$^{-6}$ A flowed when V$_g$=10 V. The transistor had an on-off ratio in excess of 10$^2$. A field effect mobility was calculated from an output characteristic. As a result, a field effect mobility of about 10 cm$^2$(Vs)$^{-1}$ was obtained in a saturation region.

(Production of TFT Device Using In$_2$O$_2$ Amorphous Oxide Film by Means of PLD Method)

A top gate TFT device shown in FIG. 5 was produced. At first, an In$_2$O$_3$ amorphous oxide film having a thickness of 80 nm to be used as a channel layer (2) was formed on a polyethylene terephthalate (PET) film (1) by means of the PLD method.

Then, an In$_2$O$_3$ amorphous oxide film and a gold film each having a large electric conductivity and a thickness of 30 nm were laminated on the film by means of the PLD method with the oxygen partial pressure in the chamber set to be less than 1 Pa and a voltage to be applied to an oxygen-radical-generating apparatus set to zero, to thereby form a drain terminal (5) and a source terminal (6) by means of a photolithography method and a lift-off method. Finally, a Y$_2$O$_3$ film to be used as a gate insulation film (3) was formed by means of an electron beam deposition method, and a gold film was formed on the film to thereby form a gate terminal (4) by means of a photolithography method and a lift-off method.

Evaluation of TFT Device for Characteristics

The current-voltage characteristics of the TFT formed on the PET film were measured at room temperature. The fact that a drain current I$_{DS}$ increased with increasing drain voltage V$_{DS}$ shows that the channel is an n-type semiconductor. This is not in contradiction to the fact that an In—O-based amorphous oxide film is an n-type conductor. I$_{DS}$ saturated (pinched off) at V$_{DS}$ of about 5 V. The saturation is a typical behavior of a transistor. A current I$_{DS}$=2×10$^8$ A flowed when V$_g$=0 V, while a current I$_{DS}$=2.0×10$^{-6}$ A flowed when V$_G$=10 V. This corresponds to the fact that a gate bias enabled an electron carrier to be induced in an In—O-based amorphous oxide film as an insulator.

The transistor had an on-off ratio of about 10$^2$. The field effect mobility was calculated from an output characteristic. As a result, a field effect mobility of about 10 cm$^2$(Vs)$^{-1}$ was obtained in a saturation region. A TFT device produced on a glass substrate showed similar characteristics.

The device produced on the PET film was bent at a radius of curvature of 30 mm to perform similar measurement of transistor characteristics. However, no changes in transistor characteristics were observed.

(Production of TFT Device Using In—Sn—O-Based Amorphous Oxide Film by Means of PLD Method)

A top gate TFT device shown in FIG. 5 was produced. At first, an In—Sn—O-based amorphous oxide film having a thickness of 100 nm to be used as a channel layer (2) was formed on a polyethylene terephthalate (PET) film (1) by means of the PLD method. Then, an In—Sn—O-based amorphous oxide film and a gold film each having a large electric conductivity and a thickness of 30 nm were laminated on the film by means of the PLD method with the oxygen partial pressure in the chamber set to be less than 1 Pa and a voltage to be applied to an oxygen-radical-generating apparatus set to zero, to thereby form a drain terminal (5) and a source terminal (6) by means of a photolithography method and a lift-off method. Finally, a Y$_2$O$_3$ film to be used as a gate insulation film (3) was formed by means of an electron beam deposition method, and a gold film was formed on the film to thereby form a gate terminal (4) by means of a photolithography method and a lift-off method.

Evaluation of TFT Device for Characteristics

The current-voltage characteristics of the TFT formed on the PET film were measured at room temperature. The fact that a drain current I$_{DS}$ increased with increasing drain voltage V$_{DS}$ shows that the channel is an n-type semiconductor. This is not in contradiction to the fact that an In—Sn—O-based amorphous oxide film is an n-type conductor. I$_{DS}$ saturated (pinched off) at V$_{DS}$ of about 6 V. The saturation is a typical behavior of a transistor. A current I$_{DS}$=5×10$^{-8}$ A flowed when V$_g$=0 V, while a current I$_{DS}$=5.0×10$^{-5}$ A flowed when V$_G$=10 V. This corresponds to the fact that a gate bias enabled an electron carrier to be induced in an In—Sn—O-based amorphous oxide film as an insulator.

The transistor had an on-off ratio of about 10$^3$. The field effect mobility was calculated from an output characteristic. As a result, a field effect mobility of about 5 cm$^2$(Vs)$^1$ was obtained in a saturation region. A TFT device produced on a glass substrate showed similar characteristics.

The device produced on the PET film was bent at a radius of curvature of 30 mm to perform similar measurement of transistor characteristics. However, no changes in transistor characteristics were observed.

(Production of TFT Device Using In—Ga—O-Based Amorphous Oxide Film by Means of PLD Method)

A top gate TFT device shown in FIG. 5 was produced. At first, an In—Ga—O-based amorphous oxide film having a thickness of 120 nm to be used as a channel layer (2) was formed on a polyethylene terephthalate (PET) film (1) by means of a film forming method shown in Example 6. Then, an In—Ga—O-based amorphous oxide film and a gold film each having a large electric conductivity and a thickness of 30 nm were laminated on the film by means of the PLD method with the oxygen partial pressure in the chamber set to be less than 1 Pa and a voltage to be applied to an oxygen-radical-generating apparatus set to zero, to thereby form a drain terminal (5) and a source terminal (6) by means of a photolithography method and a lift-off method. Finally, a Y$_2$O$_3$ film to be used as a gate insulation film (3) was formed by means of an electron beam deposition method, and a gold film was formed on the film to thereby form a gate terminal (4) by means of a photolithography method and a lift-off method.

Evaluation of TFT Device for Characteristics

The current-voltage characteristics of the TFT formed on the PET film were measured at room temperature. The fact that a drain current I$_{DS}$ increased with increasing drain voltage V$_{DS}$ shows that the channel is an n-type semiconductor. This is not in contradiction to the fact that an In—Ga—O-based amorphous oxide film is an n-type conductor. I$_{DS}$ saturated (pinched off) at $V_{DS}$ of about 6 V. The saturation is a typical behavior of a transistor. A current $I_{DS}=1\times10^{-8}$ A flowed when $V_g=0$ V, while a current $I_{DS}=1.0\times10^{-6}$ A flowed when $V_G=10$ V. This corresponds to the fact that a gate bias enabled an electron carrier to be induced in an In—Ga—O-based amorphous oxide film as an insulator.

The transistor had an on-off ratio of about $10^2$. The field effect mobility was calculated from an output characteristic. As a result, a field effect mobility of about $0.8$ cm$^2$(Vs)$^1$ was obtained in a saturation region. A TFT device produced on a glass substrate showed similar characteristics.

The device produced on the PET film was bent at a radius of curvature of 30 mm to perform similar measurement of transistor characteristics. However, no changes in transistor characteristics were observed.

An amorphous oxide having an electron carrier concentration of less than $10^{18}$/cm$^3$ is applicable to a channel layer of a TFT. The electron carrier concentration was more preferably $10^{17}$/cm$^3$ or less, or still more preferably $10^{16}$/cm$^3$ or less.

Second Embodiment

The present invention also relates to a light control device obtained by connecting, to a drain as an output terminal of a field effect TFT, an input electrode of a light-emitting device such as an electroluminescent device; or a light transmittance control device or a light reflectance control device composed of a liquid crystal cell or an electrophoretic particle cell.

Figure 7:
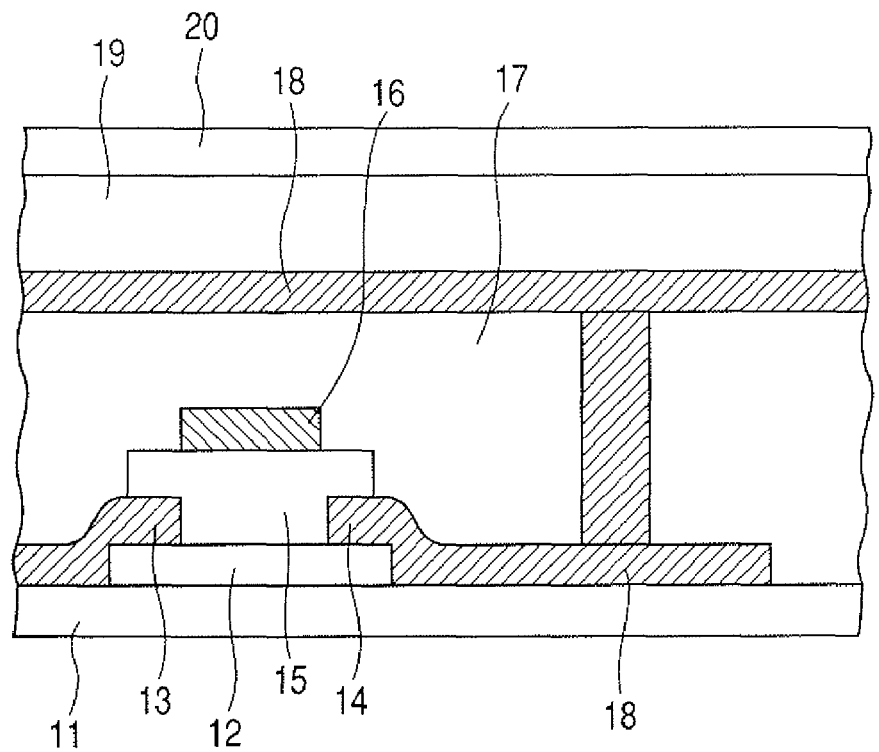
FIG. 7 is a schematic sectional view of a light control device.

Description will be made with reference to FIG. 7.

A TFT is constituted by an amorphous oxide semiconductor film 12 deposited and patterned on a substrate 11, a source electrode 13, a drain electrode 14, a gate insulation film 15, and a gate electrode 16.

An electrode 18 is connected to the drain electrode 14 via an interlayer insulation film 17. The electrode 18 is in contact with a light-emitting layer 19, and the light-emitting layer 19 is in contact with an electrode 20.

A current to be injected into the light-emitting layer 19 is controlled on the basis of the value for a current flowing from the source electrode 13 to the drain electrode 14 via a channel formed in the amorphous oxide semiconductor film 12. That is, the current can be controlled by means of a voltage to be applied by the gate electrode 16.

Here, the light-emitting layer 19 is preferably an inorganic or organic electroluminescent device.

In addition, as shown in FIG. 8, the drain electrode 14 may be extended to serve as the electrode 18. That is, the drain electrode 14 may be the electrode 18 for applying a voltage to a light transmittance control device or a light reflectance control device composed of a liquid crystal cell or electrophoretic particle cell 23 sandwiched between high-resistance films 21 and 22.

With the above constitution, the voltage to be applied to the light transmittance control device or the light reflectance control device can be controlled on the basis of the value for a current flowing from the source electrode 13 to the drain electrode 14 via a channel formed in the amorphous oxide semiconductor film 12.

That is, the voltage can be controlled by means of the voltage of the gate 6 of the TFT. The high-resistance films 21 and 22 are not needed when the light transmittance control device or the light reflectance control device is a capsule obtained by sealing a fluid and a particle into an insulating coat.

A representative structure for each of the TFT's in the above two examples is a top gate and coplanar structure. However, the present invention is not necessarily limited to the structure. Any other structure such as a staggered structure can also be used as long as a drain electrode as an output terminal of a TFT and a light-emitting device are connected so as to be topologically identical to each other.

Shown in each of the above two examples is an example in which a pair of electrodes for driving a light-emitting device, a light transmittance control device, or a light reflectance control device is arranged in parallel with a substrate. However, the present invention is not necessarily limited to the structure.

At least one of the electrodes may be arranged perpendicular to the substrate as long as the drain electrode as the output terminal of the TFT and the light-emitting device are connected so as to be topologically identical to each other.

Furthermore, only one TFT to be connected to a light-emitting device, a light transmittance control device, or a light reflectance control device is shown in each of the above two examples. However, the present invention is not necessarily limited to the structure.

The TFT shown in the figure may be connected to another TFT according to the present invention as long the TFT shown in the figure corresponds to the final stage of a circuit constituted by the TFT's.

When a pair of electrodes for driving a light-emitting device, a light transmittance control device, or a light reflectance control device is arranged in parallel with a substrate, an electrode of one of the light-emitting device and the light reflectance control device needs to be transparent with respect to a luminous wavelength or the wavelength of reflected light. Alternatively, both electrodes of a light transmittance control device need to be transparent with respect to transmitted light. The term "transparent" as used herein refers to a concept that includes of course one which is substantially transparent and one having light transmissivity.

Furthermore, all constituents of the TFT of the present invention may be transparent. In this case, a transparent light control device can be obtained. In addition, such light control device can be arranged on a substrate having low heat resistance such as a light weight, flexible, and transparent plastic substrate made of a resin.

The multiple light control devices each of which is described in the first or second embodiment can be arranged two-dimensionally together with the multiple TFT's wired in an active matrix manner.

For example, an active matrix circuit in which the gate electrode 5 of one TFT for driving a light control device is connected to a gate wire of an active matrix and the source electrode of the TFT is wired to a signal destination is constituted. With the constitution, a display using each light control device as a pixel can be provided.

Furthermore, when multiple light control devices adjacent to each other and different from each other in luminous wavelength, transmitted light wavelength, or reflected light wavelength constitute one pixel, a color display can be provided. In this case, of course, a color filter may be used.

Other Embodiments

The present invention also relates to a broadcasting dynamic image display device such as a television receiving set including the above-described display. In particular, the display of the present invention provides a portable broadcasting dynamic image display with a light weight, flexibility, and safety with respect to breakage.

The present invention also relates to a digital information processing device such as a computer including the above-described display.

The display of the present invention has a light weight and is flexible, so it provides a stay-at-home computer display with the degree of freedom of arrangement and with portability. Furthermore, the display provides a portable digital information processing device such as a notebook computer or a personal digital assistant with a light weight, flexibility, and safety with respect to breakage.

The present invention also relates to a portable information equipment such as a cellular phone, a portable music reproducer, a portable dynamic image reproducer, or a head mount display including the above-described display. The display of the present invention provides any one of those portable information equipments with a light weight, flexibility, and safety with respect to breakage. In particular, when the display of the present invention which is made transparent is used for a head mount display, a see-through device can be provided.

The present invention also relates to an image pickup device such as a still camera or a movie camera including the above-described display. The display of the present invention provides any one of those image pickup devices with a light weight, flexibility, and safety with respect to breakage.

The present invention also relates to a building structure such as a window, a door, a ceiling, a floor, an inner wall, an outer wall, or a partition including the above-described display. Since the display of the present invention has a light weight and flexibility, and can be made transparent, it can be easily attached to any one of those building structures. In addition, the display does not impair the external appearance of the building structure when no image is displayed.

The present invention also relates to a structure such as a window, a door, a ceiling, a floor, an inner wall, an outer wall, or a partition for a movable body such as a vehicle, an airplane, or a ship including the above-described display.

Since the display of the present invention has a light weight and flexibility, and can be made transparent, it can be easily attached to any one of those building structures. In addition, the display does not impair the external appearance of the building structure when no image is displayed. When the display of the present invention which is made transparent is used for a transparent window for monitoring and observing the surroundings of a movable body, the display can display an information image if needed and does not inhibit the monitoring and observation of the surroundings if such image is not needed.

The present invention also relates to an advertising device such as advertising means in a vehicle of a public transportation, or a signboard or advertising tower in a city including the above-described display. The display of the present invention can not only always replace an invariable medium such as a printed article that has been mainly used for any such advertising device heretofore but also display a dynamic image.

EXAMPLES

Hereinafter, the examples of the present invention will be described.

At first, a method of forming a TFT using an amorphous oxide applicable to the present invention will be described.

(Formation of Amorphous In—Ga—Zn—O TFT)

A polycrystalline sintered material having an $InGaO_3(ZnO)_4$ composition is used as a target to deposit an In—Ga—Zn—O-based amorphous oxide semiconductor film having a thickness of 50 nm by means of a sputtering method on a polyether sulfine-based transparent plastic substrate with its surface treated.

The oxygen partial pressure in a chamber is $5\times10^{-2}$ Pa and the substrate temperature is 25° C. The amorphous oxide semiconductor film is patterned into an island measuring 30 μm×15 μm by means of a photolithography method.

Next, two kinds of islands measuring 35 μm×10 μm and 30 μm×10 μm each composed of an ITO film having a thickness of 50 nm are formed by means of the same film forming method and patterning method at the center of the island composed of the amorphous oxide semiconductor film at an interval of 5 μm in parallel with the direction of the longer side of the island.

It should be noted that the ends in the directions of the longer sides of those islands each composed of an ITO film are aligned with the island composed of the amorphous oxide semiconductor film measuring 30 μm×10 μm.

That is, the island composed of the amorphous oxide semiconductor film measuring 30 μm×10 μm is in contact with each ITO film in a region measuring 30 μm×5 μm at each end in the direction of the shorter side.

The island composed of an ITO film measuring 35 μm×10 μm extends off the island composed of the amorphous oxide semiconductor film by 5 μm in the direction of the shorter side and by 5 μm on one side in the direction of the longer side. The island composed of an ITO film measuring 30 μm×10 μm extends off the island composed of the amorphous oxide semiconductor film by 5 μm only in the direction of the shorter side.

Next, an island measuring 40 μm×15 μm composed of a $Y_2O_3$ film having a thickness of 100 nm is similarly arranged on the island measuring 30 μm×15 μm composed of the amorphous oxide semiconductor film with their centers of gravity (and their longer sides) aligned with each other.

Finally, an island measuring 30 μm×5 μm composed of an ITO film having a thickness of 50 nm is formed on the island measuring 30 μm×15 μm composed of the amorphous oxide semiconductor film with the longer sides of the island composed of the ITO film in parallel with the center of the island composed of the amorphous oxide semiconductor film.

Through the above steps, the islands measuring 35 μm×10 μm and 30 μm×10 μm each composed of an ITO film serve as a source electrode and a drain electrode, respectively. The amorphous oxide semiconductor film placed at a gap between those islands serves as a channel region, and the $Y_2O_3$ film serves as a gate insulation film. Then, the island measuring 30 μm×5 μm composed of an ITO film at the uppermost portion serves as a gate electrode. Thus, a field effect n-channel TFT is constituted.

Such TFT shows characteristics of a field effect mobility of 5 $cm^2V^{-1}s^{-1}$; a threshold voltage of 1 V; and an on-off ratio of about $10^3$ or more.

Example 1

Production of Light Control Device Using the Above TFT

In the above TFT, a shorter side of the island composed of an ITO film to serve as the drain electrode is extended up to 100 μm. The extended 90-μm portion is left, and the TFT is coated with an insulating layer with wiring to the source electrode and the gate electrode secured.

A polyimide film (orientation film) is applied to the layer to perform a rubbing step.

Meanwhile, a plastic substrate having an ITO film and a polyimide film formed thereon and subjected to a rubbing step is separately prepared. The above substrate on which the TFT has been formed and the separately prepared substrate are arranged so as to be opposite to each other with a gap of 5 µm between them. A nematic liquid crystal is injected into the gap.

Furthermore, a pair of polarizing plates are arranged on both sides of the structure.

Here, when a voltage is applied to the source electrode of the TFT and the voltage applied to the gate electrode is changed, the light transmittance of only a region measuring 30 µm×90 µm as part of the island composed of an ITO film extended from the drain electrode changes.

The transmittance can be continuously changed by the voltage between a source and a drain with a gate voltage with which the TFT is in on state.

In this example, a white plastic substrate is used as a substrate on which a TFT is to be formed, and each electrode of the TFT is replaced with gold. Then, none of a polyimide film and a polarizing plate is used, and a gap between white and transparent plastic substrates is filled with a capsule obtained by coating a particle and a fluid with an insulating coat. An electrophoretic particle is used as the particle.

The voltage between the extended drain electrode and the upper ITO film is controlled by the above TFT. The vertical movement of the particle in the capsule enables the reflectance of the extended drain electrode region seen from the side of the transparent substrate to be controlled.

In this example, multiple TFT's are formed so as to be adjacent to each other to constitute, for example, a current control circuit typically constituted by four transistors and one capacitor. In addition, the TFT shown in FIG. 7 may be used for one of the transistors on the final stage to drive a light-emitting device.

For example, the above-described TFT using an ITO film for a drain electrode is used, and an organic electroluminescent device composed of a charge-injecting layer and a light-emitting layer is formed in a region measuring 30 µm×90 µm as part of the island composed of the ITO film extend from the drain electrode.

Example 2

Display Using the Above Light Control Device

The above light control devices are arranged two-dimensionally. For example, the light transmittance control device or light reflectance control device of Example 1 is used.

7,425×1,790 light control devices each having an area of about 30 µm×115 µm including its TFT are arranged in a square array at pitches of 40 µm and 120 µm in directions of shorter and longer sides, respectively. 1,790 gate wires penetrating the gate electrodes of the 7,425 TFT's are arranged in the direction of the longer side. Then, 7,425 signal wires penetrating the portions of the source electrodes of the 1,790 TFT's extending off the island composed of the amorphous oxide semiconductor film by 5 µm are arranged.

The respective wires are connected to a gate driver circuit and a source driver circuit. Furthermore, a color filter which is aligned at the same size as that of each light control device and in which R, G, and B repeat in the direction of the longer side is arranged on the surface. Thus, an A4-size active matrix color display at about 211 ppi can be constituted.

In the light control device using the light-emitting device of Example 1 as well, out of the four TFT's in one light control device, the gate electrode of a first TFT is wired to a gate wire and the source electrode of a second TFT is wired to a signal wire. Furthermore, the luminous wavelength of a light-emitting device is caused to repeat in the direction of the longer side by R, G, and B, whereby a light-emitting color display having the same resolution can be constituted.

Here, a driver circuit for driving an active matrix may be constituted by using the TFT of the present invention which is the same as that of a pixel, or an existing IC chip may be used for the circuit.

Example 3

Device Including the Above Display

The above display is provided with a device essential to a broadcasting dynamic image display device such as a broadcasting receiving device or a voice and image processing device, and the resultant is included in a thin casing together with a power source and an interface. Thus, a broadcasting dynamic image display device having a light weight, a thin thickness, and high safety with respect to falling and an impact is provided.

In addition, the above display is connected to a device essential to a digital information processing device such as a central processor, a storage device, or a network device, and the resultant is included in a thin casing together with a power source and an interface. Thus, an integrated digital information processing device having a light weight, a thin thickness, and high portability is provided.

In addition, the area and number of light control devices of the above display are reduced to about to 2 to 5 inches in a diagonal line. The display is connected to a device essential to a portable information equipment such as a processor, a storage device, or a network device, and the resultant is included in a small and thin casing together with a power source and an interface. Thus, a portable information equipment having a light weight, a small size, a thin thickness, and high safety with respect to falling and an impact is provided.

In addition, a similar small display is connected to a device essential to an image pickup device such as an imaging device, a storage device, or a signal processing device, and the resultant is included in a small and light weight casing together with a power source and an interface. Thus, an image pickup device having a light weight, a small size, and high safety with respect to falling and an impact is provided.

In addition, oppositely, the display in which the size of one light control device is enlarged and the display area of which is enlarged is attached to or incorporated into any one of the above building structures, whereby a building structure capable of displaying an arbitrary image is provided.

In addition, the display is incorporated as any one of the above structures for movable bodies, whereby a structure for a movable body capable of displaying an arbitrary image is provided.

In addition, the display is incorporated as part of any one of the above advertising devices, whereby an advertising device capable of displaying an arbitrary image is provided.

The light control device and the display according to the present invention can find use in a wide variety of applications including a broadcasting dynamic image display device, a digital information processing device, a portable information equipment, an image pickup device, a building structure, a structure for a movable body, and an advertising device each of which has a light weight, a thin thickness, and high safety with respect to breakage.

What is claimed is:

1. An active matrix display comprising:
   an electroluminescent device; and
   a field effect transistor for driving the electroluminescent device having an active layer,
   wherein the active layer of the field effect transistor comprises an amorphous oxide wherein:
   (a) the amorphous oxide of the active layer is selected from the group consisting of an oxide containing In, Ga and Zn, an oxide containing In, Zn and Sn, an oxide containing In and Zn, an oxide containing In and Sn, and an oxide containing In; and wherein
   (b) the amorphous oxide has an electron carrier concentration of $10^{12}/cm^3$ or more and less than $10^{18}/cm^3$, and wherein a current between drain and source terminals of the field effect transistor when no gate voltage is applied is less than 10 microamperes; and wherein
   (c) the amorphous oxide has an oxygen defect density decreased by treatment in an atmosphere containing oxygen at a predetermined pressure upon or after film formation thereof.

2. The active matrix display according to claim 1, wherein the field effect transistor is such that a current and a voltage between the drain and source terminals when no gate voltage is applied and (transistor length/transistor width) satisfy $I_{DS} < (W/L) \times V_{DS} \times (1.0 \times 10^{-5}/24)$ [A] when $V_{GS}=0$ [V], where L is a channel length and W is a channel width, and wherein the amorphous oxide has a halo pattern and shows no specific diffraction ray in an X-ray diffraction spectrum.

3. The active matrix display according to claim 2, wherein the current and the voltage between the drain and source terminals when no gate voltage is applied and (transistor length/transistor width) satisfy $I_{DS} < (W/L) \times V_{DS} \times (5.0 \times 10^{-8}/24)$ [A] when $V_{GS}=0$ [V], where L is the channel length and W is the channel width.

4. The active matrix display according to claim 1, wherein the amorphous oxide has an observable halo pattern, and shows no specific diffraction ray in an X-ray diffraction spectrum.

5. The active matrix display according to claim 1, wherein an electron mobility of the active layer tends to increase with increasing electron carrier concentration.

6. An active matrix display comprising:
   an electroluminescent device; and
   a field effect transistor for driving the electroluminescent device,
   wherein an active layer of the field effect transistor comprises an amorphous oxide of a compound having
   (a) a composition when in a crystalline state represented by $In_{2-x}M3_xO_3 (Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
   (b) an electron carrier concentration of $10^{12}/cm^3$ or more and less than $10^{18}/cm^3$, wherein a current between drain and source terminals of the field effect transistor when no gate voltage is applied is less than 10 microamperes; and
   (c) oxygen defect density decreased by treatment in an atmosphere containing oxygen at a predetermined pressure upon or after film formation thereof.

7. The active matrix display according to claim 6, wherein the amorphous oxide additionally contains at least one of Sn and a Group IV element selected from Si, Ge or Zr.

8. The active matrix display according to claim 6, wherein the amorphous oxide comprises an oxide containing In, Ga, and Zn.

9. The active matrix display according to claim 6, wherein the electroluminescent device is arranged on a flexible resin substrate.

10. The active matrix display according to claim 6, wherein the electroluminescent device is arranged on a light transmissive substrate.

11. The active matrix display according to claim 6, wherein the amorphous oxide has an observable halo pattern, and shows no specific diffraction ray in an X-ray diffraction spectrum.

12. The active matrix display according to claim 6, wherein an electron mobility of the active layer tends to increase with increasing electron carrier concentration.

13. An active matrix display comprising:
    an organic electroluminescent device; and
    a field effect transistor for driving the organic electroluminescent device,
    wherein an active layer of the field effect transistor comprises an amorphous oxide that
    (a) is selected from the group consisting of an oxide containing In, Ga and Zn, an oxide containing In, Zn and Sn, an oxide containing In and Zn, an oxide containing In and Sn, and an oxide containing In; and
    (b) has an electron carrier concentration of $10^{12}/cm^3$ or more and less than $10^{18}/cm^3$, wherein a current between drain and source terminals of the field effect transistor when no gate voltage is applied is less than 10 microamperes; and
    (c) has an oxygen defect density decreased by treatment in an atmosphere containing oxygen at a predetermined pressure upon or after film formation thereof.

14. The active matrix display according to claim 13, wherein the field effect transistor is such that a current and a voltage between the drain and source terminals when no gate voltage is applied and (transistor length/transistor width) satisfy $I_{DS} < (W/L) \times V_{DS} \times (1.0 \times 10^{-5}/24)$ [A] when $V_{GS}=0$ [V], where L is a channel length and W is a channel width, and wherein the amorphous oxide has a halo pattern and shows no specific diffraction ray in an X-ray diffraction spectrum.

15. The active matrix display according to claim 14, wherein the current and the voltage between the drain and source terminals when no gate voltage is applied and (transistor length/transistor width) satisfy $I_{DS} < (W/L) \times V_{DS} \times (5.0 \times 10^{-8}/24)$ [A] when $V_{GS}=0$ [V], where L is the channel length and W is the channel width.

16. The active matrix display according to claim 13, wherein the amorphous oxide has an observable halo pattern, and shows no specific diffraction ray in an X-ray diffraction spectrum.

17. The active matrix display according to claim 13, wherein an electron mobility of the active layer tends to increase with increasing electron carrier concentration.

18. An active matrix display comprising:
    a light control device; and
    a field effect transistor for driving the light control device,
    wherein an active layer of the field effect transistor comprises an amorphous oxide that
    (a) is selected from the group consisting of an oxide containing In, Ga and Zn, an oxide containing In, Zn and Sn, an oxide containing In and Zn, an oxide containing In and Sn, and an oxide containing In; and
    (b) has an electron carrier concentration of $10^{12}/cm^3$ or more and less than $10^{18}/cm^3$, wherein a current between drain and source terminals of the field effect transistor when no gate voltage is applied is less than 10 microamperes; and (c) has an oxygen defect density decreased by treatment in an atmosphere containing oxygen at a predetermined pressure upon or after film formation thereof.

19. The active matrix display according to claim 18, wherein the light control device comprises one of an electroluminescent device, a liquid crystal and an electrophoretic particle.

20. The active matrix display according to claim 18, wherein the field effect transistor is such that a current and a voltage between the drain and source terminals when no gate voltage is applied and (transistor length/transistor width) satisfy $I_{DS} < (W/L) \times V_{DS} \times (1.0 \times 10^{-5}/24)$ [A] when $V_{GS} = 0$ [V], where L is a channel length and W is a channel width, and wherein the amorphous oxide has a halo pattern and shows no specific diffraction ray in an X-ray diffraction spectrum.

21. The active matrix display according to claim 20, wherein the current and the voltage between the drain and source terminals when no gate voltage is applied and (transistor length/transistor width) satisfy $I_{DS} < (W/L) \times V_{DS} \times (5.0 \times 10^{-8}/24)$ [A] when $V_{GS} = 0$ [V], where L is the channel length and W is the channel width.

22. The active matrix display according to claim 18, wherein the amorphous oxide has an observable halo pattern, and shows no specific diffraction ray in an X-ray diffraction spectrum.

23. The active matrix display according to claim 18, wherein an electron mobility of the active layer tends to increase with increasing electron carrier concentration.

24. An active matrix display comprising:
a light control device; and
a field effect transistor for driving the light control device,
wherein an active layer of the field effect transistor comprises an amorphous oxide that
(a) has a composition when in a crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds; and
(b) has an electron carrier concentration of $10^{12}/cm^3$ or more and less than $10^{18}/cm^3$, wherein a current between drain and source terminals of the field effect transistor when no gate voltage is applied is less than 10 microamperes; and
(c) has an oxygen defect density decreased by treatment in an atmosphere containing oxygen at a predetermined pressure upon or after film formation thereof.

25. The active matrix display according to claim 24, wherein the field effect transistor is such that a current and a voltage between the drain and source terminals when no gate voltage is applied and (transistor length/transistor width) satisfy $I_{DS} < (W/L) \times V_{DS} \times (1.0 \times 10^{-5}/24)$ [A] when $V_{GS} = 0$ [V], where L is a channel length and W is a channel width, and wherein the amorphous oxide has a halo pattern and shows no specific diffraction ray in an X-ray diffraction spectrum.

26. The active matrix display according to claim 25, wherein the current and the voltage between the drain and source terminals when no gate voltage is applied and (transistor length/transistor width) satisfy $I_{DS} < (W/L) \times V_{DS} \times (5.0 \times 10^{-8}/24)$ [A] when $V_{GS} = 0$ [V], where L is the channel length and W is the channel width.

27. The active matrix display according to claim 24, wherein the amorphous oxide has an observable halo pattern, and shows no specific diffraction ray in an X-ray diffraction spectrum.

28. The active matrix display according to claim 24, wherein an electron mobility of the active layer tends to increase with increasing electron carrier concentration.

29. An active matrix display comprising:
an organic electroluminescent device; and
a field effect transistor for driving the organic electroluminescent device,
wherein an active layer of the field effect transistor comprises an amorphous oxide of a compound having
(a) a composition when in a crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
(b) an electron carrier concentration of $10^{12}/cm^3$ or more and less than $10^{18}/cm^3$, wherein a current between drain and source terminals of the field effect transistor when no gate voltage is applied is less than 10 microamperes; and
(c) oxygen defect density decreased by treatment in an atmosphere containing oxygen at a predetermined pressure upon or after film formation thereof.

30. The active matrix display according to claim 29, wherein the field effect transistor is such that a current and a voltage between the drain and source terminals when no gate voltage is applied and (transistor length/transistor width) satisfy $I_{DS} < (W/L) \times V_{DS} \times (1.0 \times 10^{-5}/24)$ [A] when $V_{GS} = 0$ [V], where L is a channel length and W is a channel width, and wherein the amorphous oxide has a halo pattern and shows no specific diffraction ray in an X-ray diffraction spectrum.

31. The active matrix display according to claim 30, wherein the current and the voltage between the drain and source terminals when no gate voltage is applied and (transistor length/transistor width) satisfy $I_{DS} < (W/L) \times V_{DS} \times (5.0 \times 10^{-8}/24)$ [A] when $V_{GS} = 0$ [V], where L is the channel length and W is the channel width.

32. The active matrix display according to claim 29, wherein the amorphous oxide has an observable halo pattern, and shows no specific diffraction ray in an X-ray diffraction spectrum.

33. The active matrix display according to claim 29, wherein an electron mobility of the active layer tends to increase with increasing electron carrier concentration.

* * * * *